United States Patent
Novak et al.

(10) Patent No.: US 6,525,622 B1
(45) Date of Patent: *Feb. 25, 2003

(54) ADDING ELECTRICAL RESISTANCE IN SERIES WITH BYPASS CAPACITORS TO ACHIEVE A DESIRED VALUE OF ELECTRICAL IMPEDANCE BETWEEN CONDUCTS OF AN ELECTRICAL POWER DISTRIBUTION STRUCTURE

(75) Inventors: Istvan Novak, Maynard, MA (US); Valerie A. St. Cyr, Lincoln, MA (US); Merle Tetreault, Tyngsboro, MA (US); Daniel C. Irish, Goffstown, NH (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/715,723

(22) Filed: Nov. 17, 2000

(51) Int. Cl.$^7$ .................................................. H03H 7/38
(52) U.S. Cl. ........................ 333/32; 333/28 R; 333/12
(58) Field of Search ................................. 333/32, 28 R, 333/12

(56) References Cited

U.S. PATENT DOCUMENTS

| | | | |
|---|---|---|---|
| 3,209,284 A | 9/1965 | Hast | 333/116 |
| 3,678,417 A | 7/1972 | Ragan et al. | 333/22 R |
| 4,371,746 A | 2/1983 | Pepper, Jr. | 178/18 |
| 4,626,889 A | 12/1986 | Yamamoto et al. | 357/71 |
| 5,068,631 A * | 11/1991 | Vince | 174/250 |
| 5,114,912 A | 5/1992 | Benz | 505/1 |
| 5,266,036 A | 11/1993 | Lichtenwalter et al. | 439/65 |
| 5,523,727 A | 6/1996 | Shingyoji | 333/22 R |
| 5,670,917 A | 9/1997 | Mazzochette | 333/22 R |
| 5,708,400 A | 1/1998 | Morris | 333/12 |
| 5,818,315 A | 10/1998 | Moongilan | 333/238 |
| 5,844,762 A | 12/1998 | Yamamua, et al. | 361/111 |
| 5,898,576 A | 4/1999 | Lockwood, et al. | 361/782 |
| 5,966,294 A | 10/1999 | Harada, et al. | 361/794 |
| 6,058,022 A * | 5/2000 | Gianni et al. | 257/728 |
| 6,104,258 A | 8/2000 | Novak | 333/23 R |
| 6,198,362 B1 | 3/2001 | Harada et al. | 333/12 |
| 6,215,373 B1 * | 4/2001 | Novak et al. | 333/12 |

FOREIGN PATENT DOCUMENTS

| | | |
|---|---|---|
| DE | 19911731 | 10/1999 |
| EP | 0873046 A1 | 10/1998 |
| WO | 99/60699 | 11/1999 |
| WO | 99/66555 | 12/1999 |

OTHER PUBLICATIONS

O'Sullivan et al., "Developing a Decoupling Methodology with SPICE for Multilayer Printed Circuit Boards," ©1998 IEEE, pp. 652–655.

Lee et al., "Modeling and Analysis of Multichip Module Power Supply Planes," IEEE Transactions on Components Packaging, and Manufacturing Technology—Part B, vol. 18, No. 4, Nov. 1995, pp. 628–639.

* cited by examiner

Primary Examiner—Robert Pascal
Assistant Examiner—Joseph Chang
(74) Attorney, Agent, or Firm—Meyertons Hood Kivlin Kowert & Goetzel, P.C.; B. Noël Kivlin

(57) ABSTRACT

Apparatus and methods for achieving a desired value of electrical impedance between parallel planar conductors of an electrical power distribution structure by electrically coupling multiple bypass capacitors and corresponding electrical resistance elements in series between the planar conductors. The methods include bypass capacitor selection criteria and electrical resistance determination criteria based upon simulation results. An exemplary electrical power distribution structure produced by one of the methods includes a pair of parallel planar conductors separated by a dielectric layer, n discrete electrical capacitors, and n electrical resistance elements, where $n \geq 2$. Each of the n discrete electrical resistance elements is coupled in series with a corresponding one of the n discrete electrical capacitors between the planar conductors. The n capacitors have substantially the same capacitance C, mounted resistance $R_m$, mounted inductance $L_m$, and mounted resonant frequency $f_{m\text{-}res}$. The mounted resistance $R_m$ of each of the n capacitors includes an electrical resistance of the corresponding electrical resistance element. The electrical power distribution structure achieves an electrical impedance Z at the resonant frequency $f_{m\text{-}res}$ of the capacitors. The mounted resistance $R_m$ of each of the n capacitors is substantially equal to $(n \cdot Z)$. The mounted inductance $L_m$ of each of the n capacitors is less than or equal to $(0.2 \cdot n \cdot \mu_0 \cdot h)$, where $\mu_0$ is the permeability of free space, and h is a distance between the planar conductors.

6 Claims, 26 Drawing Sheets

ADDING ELECTRICAL RESISTANCE IN SERIES WITH BYPASS CAPACITORS TO ACHIEVE A DESIRED VALUE OF ELECTRICAL IMPEDANCE BETWEEN CONDUCTS OF AN ELECTRICAL POWER DISTRIBUTION STRUCTURE

BACKGROUND OF THE INVENTION

1. Field of the Invention

This invention relates to electronic systems, and more particularly to electrical interconnecting apparatus forming electrical power distribution structures.

2. Description of the Related Art

A power distribution network of a typical printed circuit board (PCB) includes several capacitors coupled between conductors used to convey direct current (d.c.) electrical power voltages and ground conductors. For example, the power distribution network of a digital PCB typically includes a bulk decoupling or "power entry" capacitor located at a point where electrical power enters the PCB from an external power supply. The power distribution network also typically includes a decoupling capacitor positioned near each of several digital switching circuits (e.g., digital integrated circuits coupled to the PCB). The digital switching circuits dissipate electrical power during switching times (e.g., clock pulse transitions). Each decoupling capacitor typically has a capacitance sufficient to supply electrical current to the corresponding switching circuit during switching times such that the d.c. electrical voltage supplied to the switching circuit remains substantially constant. The power entry capacitor may, for example, have a capacitance greater than or equal to the sum of the capacitances of the decoupling capacitors.

In addition to supplying electrical current to the corresponding switching circuits during switching times, decoupling capacitors also provide low impedance paths to the ground electrical potential for alternating current (a.c.) voltages. Decoupling capacitors thus shunt or "bypass" unwanted a.c. voltages present on d.c. power trace conductors to the ground electrical potential. For this reason, the terms "decoupling capacitor" and "bypass capacitor" are often used synonymously.

As used herein, the term "bypass capacitor" is used to describe any capacitor coupled between a d.c. voltage conductor and a ground conductor, thus providing a low impedance path to the ground electrical potential for a.c. voltages.

A typical bypass capacitor is a two-terminal electrical component. FIG. 1 is a diagram of an electrical model 10 of a capacitor (e.g., a bypass capacitor) valid over a range of frequencies including a resonant frequency $f_{res}$ of the capacitor. Electrical model 10 includes an ideal capacitor, an ideal resistor, and an ideal inductor in series between the two terminals of the capacitor. The ideal capacitor has a value C equal to a capacitance of the capacitor. The ideal resistor has a value equal to an equivalent series resistance (ESR) of the capacitor, and the ideal inductor has a value equal to an equivalent series inductance (ESL) of the capacitor. The series combination of the capacitance (C) and the inductance (ESL) of the capacitor results in series resonance and a resonant frequency $f_{res}$ given by:

$$f_{res} = \frac{1}{2\pi\sqrt{(ESL)(C)}}.$$

FIG. 2 is a graph of the logarithm of the magnitude of the electrical impedance (Z) between the terminals of electrical model 10 versus the logarithm of frequency f. At frequencies flower than resonant frequency $f_{res}$, the impedance of electrical model 10 is dominated by the capacitance, and the magnitude of Z decreases with increasing frequency f. At the resonant frequency $f_{res}$ of the capacitor, the magnitude of Z is a minimum and equal to the ESR of the capacitor. Within a range of frequencies centered about resonant frequency $f_{res}$, the impedance of electrical model 10 is dominated by the resistance, and the magnitude of Z is substantially equal to the ESR of the capacitor. At frequencies f greater than resonant frequency $f_{res}$, the impedance of electrical model 10 is dominated by the inductance, and the magnitude of Z increases with increasing frequency f.

When a desired electrical impedance between a d.c. voltage conductor and a ground conductor is less than the ESR of a single capacitor, it is common to couple more than one of the capacitors in parallel between the d.c. voltage conductor and the ground conductor. In this situation, all of the capacitors have substantially the same resonant frequency $f_{res}$, and the desired electrical impedance is achieved over a range of frequencies including the resonant frequency $f_{res}$.

When the desired electrical impedance is to be achieved over a range of frequencies broader than a single capacitor can provide, it is common to couple multiple capacitors having different resonant frequencies between the d.c. voltage conductor and the ground conductor. The ESRs and resonant frequencies of the capacitors are selected such that each of the capacitors achieves the desired electrical impedance over a different portion of the range of frequencies. In parallel combination, the multiple capacitors achieve the desired electrical impedance over the entire range of frequencies.

A digital signal alternating between high and low voltage levels includes contributions from a fundamental sinusoidal frequency (i.e., a first harmonic) and integer multiples of the first harmonic. As the rise and fall times of a digital signal decrease, the magnitudes of a greater number of the integer multiples of the first harmonic become significant. As a general rule, the frequency content of a digital signal extends to a frequency equal to the reciprocal of π times the transition time (i.e., rise or fall time) of the signal. For example, a digital signal with a 1 nanosecond transition time has a frequency content extending up to about 318 MHz.

All conductors have a certain amount of electrical inductance. The voltage across the inductance of a conductor is directly proportional to the rate of change of current through the conductor. At the high frequencies present in conductors carrying digital signals having short transition times, a significant voltage drop occurs across a conductor having even a small inductance. Transient switching currents flowing through electrical impedances of d.c. power conductors cause power supply voltage perturbations (e.g., power supply "droop" and ground "bounce"). As signal frequencies increase, continuous power supply planes (e.g., power planes and ground planes) having relatively low electrical inductances are being used more and more. The parallel power and ground planes are commonly placed in close proximity to one another in order to further reduce the inductances of the planes.

The magnitude of electrical impedance between two parallel conductive planes (e.g., adjacent power and ground planes) may vary widely within the frequency ranges of electronic systems with digital signals having short transition times. The parallel conductive planes may exhibit multiple electrical resonances, resulting in alternating high and low impedance values. High impedance values between power and ground planes are undesirable as transient switching currents flowing through the high electrical impedances cause relatively large power supply voltage perturbations.

It would thus be desirable to have a bypass capacitor method for achieving a desired value of electrical impedance between parallel conductive planes of an electrical power distribution structure, wherein variations in the electrical impedance are relatively small over a wide range of frequencies. It would also be advantageous if the desired method would provide for optional suppression of the electrical resonances of the planes in addition to achieving the desired value of electrical impedance over a wide range of frequencies. Magnitudes of power supply voltage perturbations resulting from transient switching currents would be significantly reduced in electrical power distribution structures resulting from applications of the above methods.

SUMMARY OF THE INVENTION

Several methods are presented for achieving a desired value of electrical impedance between conductors of an electrical power distribution structure by electrically coupling multiple bypass capacitors and corresponding electrical resistance elements in series between the conductors. The methods include bypass capacitor selection criteria and electrical resistance determination criteria based upon simulation results. An exemplary electrical power distribution structure produced by one of the methods includes a pair of parallel planar conductors separated by a dielectric layer, n discrete electrical capacitors, and n electrical resistance elements, where $n \geq 2$. Each of the n discrete electrical resistance elements is coupled in series with a corresponding one of the n discrete electrical capacitors between the planar conductors. The n capacitors have substantially the same capacitance C, mounted resistance $R_m$, mounted inductance $L_m$, and mounted resonant frequency $f_{m-res}$. The mounted resistance $R_m$ of each of the n capacitors includes an electrical resistance of the corresponding electrical resistance element. The electrical power distribution structure achieves an electrical impedance Z at the resonant frequency $f_{m-res}$ of the capacitors. In order to achieve the desired value of electrical impedance, the mounted resistance $R_m$ of each of the n capacitors is substantially equal to (n·Z). In order to reduce variations in the electrical impedance with frequency, the mounted inductance $L_m$ of each of the n capacitors is less than or equal to $(0.2 \cdot n \cdot \mu_0 \cdot h)$, where $\mu_0$ is the permeability of free space, and h is a distance between the planar conductors. It is noted that dielectric materials used to form dielectric layers are typically non-magnetic, and thus the relative permeability $\mu_r$ of the dielectric layer is assumed to be unity.

The mounted resistance $R_m$ of each of the n capacitors may be, for example, the sum of an equivalent series resistance (ESR) of the capacitor, the electrical resistance of the corresponding electrical resistance element, and the electrical resistances of all conductors coupling the capacitor between the planar conductors. The mounted inductance $L_m$ of each of the n capacitors may be the electrical inductance resulting from the coupling of the capacitor between the planar conductors. For example, each of the n capacitors may have a body. In this situation, the mounted resistance $R_m$ of each of the n capacitors may be the sum of the ESR of the capacitor body, the electrical resistance of the corresponding electrical resistance element, and the electrical resistances of all conductors (e.g., solder lands and vias) coupling the capacitor body between the planar conductors. Similarly, the mounted inductance $L_m$ of each of the n capacitors may be the electrical inductance resulting from the coupling of the capacitor body between the planar conductors. The mounted resonant frequency $f_{m-res}$ resulting from capacitance C and mounted inductance $L_m$ may be given by:

$$f_{m-res} = \frac{1}{2\pi \sqrt{(L_m)(C)}}.$$

The n discrete capacitors may or may not be used to suppress electrical resonances between the planar conductors. Where the n discrete capacitors are not used to suppress the electrical resonances, the n discrete capacitors may be located upon, and distributed about, one or more surfaces of the planar conductors. On the other hand, when the n discrete capacitors are used to suppress the electrical resonances, the n discrete capacitors may be positioned along at least a portion of corresponding outer edges of the planar conductors. In this situation, adjacent capacitors may be separated by substantially equal spacing distances.

Several embodiments of an electrical power distribution structure are presented including an electrical resistance element coupled in series with a capacitor between a pair of parallel conductive planes separated by a dielectric layer (e.g., between a power plane and a ground plane). In the embodiments, the electrical resistance elements are incorporated in ways which do not appreciably increase physical dimensions of current loops coupling the capacitor between the pair of parallel conductive planes. As a result, the mounted inductance $L_m$ of the capacitor is not changed substantially over a corresponding conventional structure.

A first method for achieving a target electrical impedance $Z_t$ in an electrical power distribution structure including a pair of parallel planar conductors separated by a dielectric layer may be useful where bypass capacitors will not be used to suppress plane resonances. In this situation, the bypass capacitors may be distributed about a surface of at least one of the planar conductors. The first method includes determining a required number n of a selected type of discrete electrical capacitor dependent upon an inductance of the electrical power distribution structure $L_p$ and a mounted inductance $L_m$ of a representative one of the selected type of discrete electrical capacitor when electrically coupled between the planar conductors, wherein $n \geq 2$. The required number n of the selected type of capacitor may be determined using:

$$n = \frac{L_m}{(0.2 \cdot L_p)}.$$

The target electrical impedance $Z_t$ is used to determine a required value of mounted resistance $R_{m-req}$ for the n discrete electrical capacitors. The required value of mounted resistance $R_{m-req}$ may be determined using:

$$R_{m-req} = n \cdot Z_t.$$

The required number n of the selected type of discrete electrical capacitor may be selected such that each of the n capacitors has an equivalent series resistance (ESR) which is less than the required value of mounted resistance $R_{m\text{-}req}$. The mounted resistance $R_m$ of a representative one of the n capacitors may be determined when the representative capacitor is coupled between the pair of parallel planar conductors and when the electrical resistance of a corresponding electrical resistance element is zero. The electrical resistance of each of n electrical resistance elements may be determined by subtracting the mounted resistance $R_m$ of the representative capacitor from the required value of mounted resistance $R_{m\text{-}req}$. The n discrete electrical capacitors and the n electrical resistance elements may be electrically coupled between the planar conductors such that each of the n discrete electrical capacitors is coupled in series with a corresponding one of the n electrical resistance elements.

The first method may also include determining a separation distance h between the parallel planar conductors required to achieve the target electrical impedance $Z_t$. The separation distance h may be determined using:

$$h = \frac{(Z_t)(\sqrt{\varepsilon_r})(d_p)}{(0.523)}$$

where $\varepsilon_r$ is the relative permittivity of the dielectric layer and $d_p$ is a distance around an outer perimeter of the electrical power distribution structure. Separation distance h is in mils when the target electrical impedance $Z_t$ is in ohms and distance $d_p$ is in inches.

A thickness t for the dielectric layer may be selected such that the thickness t is less than or equal to the required separation distance h. Thickness t may be used to determine the inductance of the electrical power distribution structure $L_p$. The inductance of the electrical power distribution structure $L_p$ may be determined using:

$$L_p = (\mu_0 \cdot t)$$

wherein $\mu_0$ is the permeability of free space.

The type of discrete electrical capacitor may be selected, wherein capacitors of the selected type have at least one substantially identical physical dimension (e.g., a length of the capacitor package between terminals) upon which the mounted inductance of the capacitors is dependent. The physical dimension may be used to determine the mounted inductance $L_m$ of the representative capacitor.

A second method for achieving a target electrical impedance $Z_t$ in an electrical power distribution structure including a pair of parallel planar conductors separated by a dielectric layer may be useful where the bypass capacitors will be used to suppress plane resonances. In this situation, at least a portion of the bypass capacitors will be electrically coupled between the planar conductors along an outer edge of the planar conductors. The second method includes determining a first required number $n_1$ of discrete electrical capacitors dependent upon an inductance of the electrical power distribution structure $L_p$ and a mounted inductance $L_m$ of each of the discrete electrical capacitors when electrically coupled between the planar conductors, where $n_1 \geq 2$. The first required number $n_1$ of the discrete electrical capacitors may be determined using:

$$n_1 = \frac{L_m}{(0.2 \cdot L_p)}.$$

A second required number $n_2$ of the discrete electrical capacitors is determined dependent upon a distance $d_p$ around an outer perimeter of the electrical power distribution structure (i.e., the parallel planar conductors) and a spacing distance S between adjacent discrete electrical capacitors, where $n_2 \geq 2$. The second required number $n_2$ of the discrete electrical capacitors may be determined using:

$$n_2 = \frac{d_p}{S}.$$

Spacing distance S may be less than or equal to a maximum spacing distance $S_{max}$ between adjacent electrical capacitors. The electrical power distribution structure may be, for example, part of an electrical interconnecting apparatus, and electrical signals may be conveyed within the electrical interconnecting apparatus. The electrical signals may have an associated frequency range, and maximum spacing distance $S_{max}$ may be a fraction of a wavelength of a maximum frequency $f_{max}$ of the frequency range of the electrical signals. Maximum spacing distance $S_{max}$ may be given by:

$$S_{max} = 0.1 \cdot \frac{c}{(\sqrt{\varepsilon_r} \cdot f_{max})}$$

wherein c is the speed of light in a vacuum, $\varepsilon_r$ is the relative permittivity (i.e., the dielectric constant) of the dielectric layer, and $f_{max}$ is the maximum frequency of the frequency range of the electrical signals.

If $n_2 \geq n_1$, the following steps may be performed. A required value of mounted resistance $R_{m\text{-}req}$ may be determined for $n_2$ of the discrete electrical capacitors dependent upon the target electrical impedance $Z_t$. The required value of mounted resistance $R_{m\text{-}req}$ for the n2 capacitors may be determined using:

$$R_{m\text{-}req} = n_2 \cdot Z_t$$

The number $n_2$ of the discrete electrical capacitors may be selected wherein each of the $n_2$ capacitors has an equivalent series resistance (ESR) which is less than the required value of mounted resistance $R_{m\text{-}req}$. The mounted resistance $R_m$ of a representative one of the $n_2$ capacitors may be determined when the representative capacitor is coupled between the pair of parallel planar conductors and when the electrical resistance of a corresponding electrical resistance element is zero. The electrical resistance of each of $n_2$ electrical resistance elements may be determined by subtracting the mounted resistance $R_m$ of the representative capacitor from the required value of mounted resistance $R_{m\text{-}req}$. The $n_2$ discrete electrical capacitors and the $n_2$ electrical resistance elements may be electrically coupled between the planar conductors along the outer perimeter of the parallel planar conductors such that each of the $n_2$ discrete electrical capacitors is coupled in series with a corresponding one of the $n_2$ electrical resistance elements.

The second method may also include the determining of a separation distance h between the parallel planar conductors required to achieve the target electrical impedance $Z_t$ as described above. A thickness t for the dielectric layer may be selected such that the thickness t is less than or equal to the required separation distance h. Thickness t may be used to determine the inductance of the electrical power distribution structure $L_p$ as described above.

The type of discrete electrical capacitor may be selected, wherein capacitors of the selected type have at least one substantially identical physical dimension (e.g., a length of the capacitor package between terminals) upon which the mounted inductance of the capacitors is dependent. The physical dimension may be used to determine the mounted inductance $L_m$ of the representative capacitor.

If $n_1 \geq n_2$, the following steps may be performed. The target electrical impedance $Z_t$ may be used to determine a required value of mounted resistance $R_{m-req}$ for $n_1$ of the discrete electrical capacitors. The required value of mounted resistance $R_{m-req}$ for the $n_1$ capacitors may be determined using:

$$R_{m-req} = n_1 \cdot Z_t.$$

The number $n_1$ of the discrete electrical capacitors may be selected, wherein each of the $n_1$ capacitors has an equivalent series resistance (ESR) which is less than the required value of mounted resistance $R_{m-req}$. The mounted resistance $R_m$ of a representative one of the $n_1$ capacitors may be determined when the representative capacitor is coupled between the pair of parallel planar conductors and when the electrical resistance of a corresponding electrical resistance element is zero. The electrical resistance of each of $n_1$ electrical resistance elements may be determined by subtracting the mounted resistance $R_m$ of the representative capacitor from the required value of mounted resistance $R_{m-req}$. The $n_1$ discrete electrical capacitors and the $n_1$ electrical resistance elements may be electrically coupled between the planar conductors such that: (i) each of the $n_1$ discrete electrical capacitors is coupled in series with a corresponding one of the $n_1$ electrical resistance elements, (ii) $n_2$ of the discrete electrical capacitors and the corresponding electrical resistance elements are positioned along an outer perimeter of the planar conductors, and (iii) the remaining $(n_1-n_2)$ capacitors and the corresponding electrical resistance elements are dispersed across a surface of at least one of the planar conductors.

Regarding distance $d_p$ around the outer edges (i.e., the outer perimeter) of the electrical power distribution structure, the electrical power distribution structure may have, for example, four sides arranged as two pairs of opposite sides. The sides forming one of the pairs of opposite sides may have equal lengths x, and the other two opposite sides may have equal lengths y. In this situation, the distance $d_p$ around the outer perimeter of the electrical power distribution structure is equal to $2 \cdot (x+y)$.

BRIEF DESCRIPTION OF THE DRAWINGS

Other objects and advantages of the invention will become apparent upon reading the following detailed description and upon reference to the accompanying drawings in which.

Figures 1, 2:
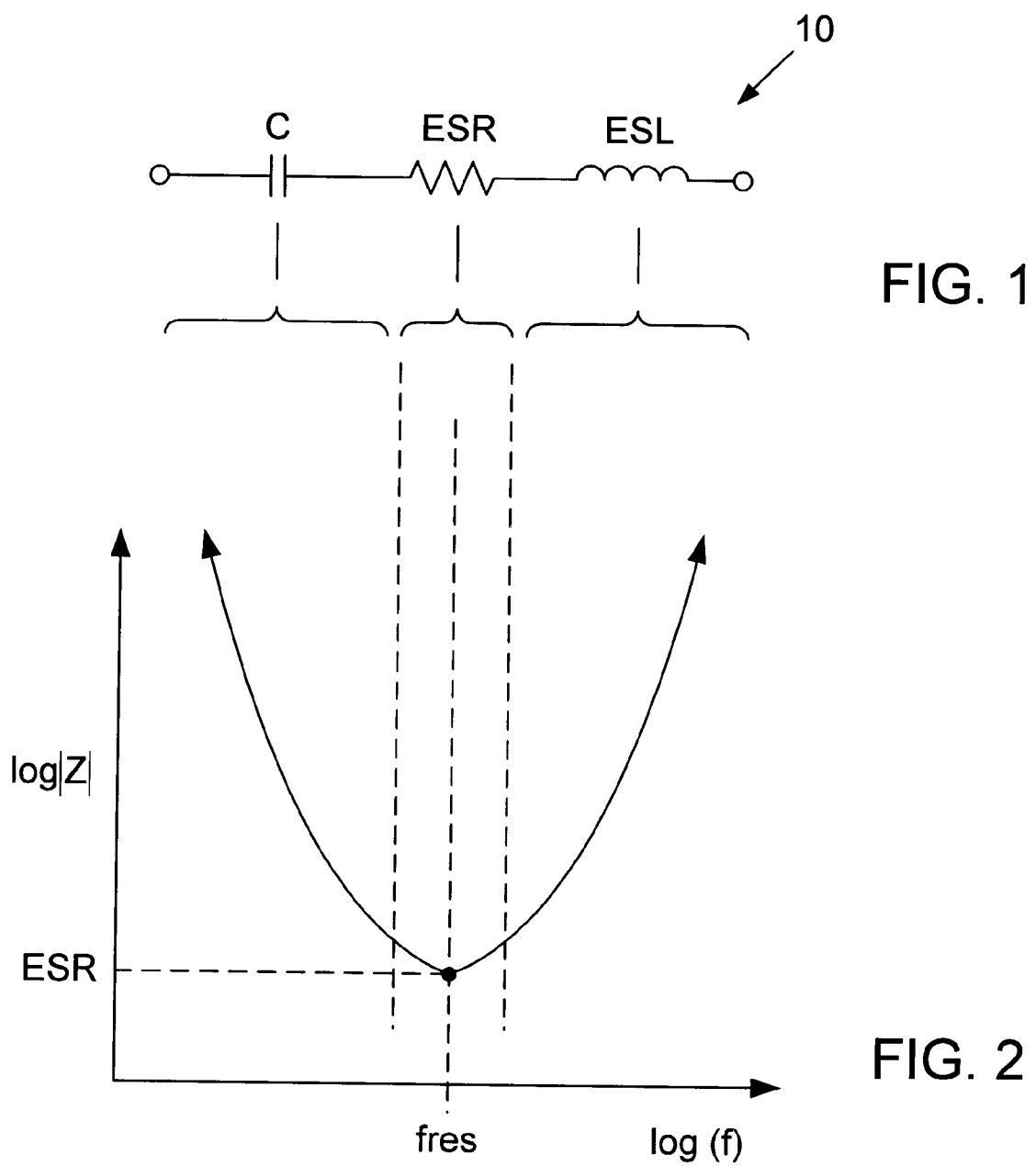
FIG. 1 is a diagram of an electrical model of a capacitor (e.g., a bypass capacitor) valid over a range of frequencies including a resonant frequency $f_{res}$ of the capacitor, wherein the electrical model includes an ideal capacitor, an ideal resistor, and an ideal inductor in series between two terminals of the capacitor, and wherein the ideal capacitor has a value C equal to a capacitance of the capacitor, and wherein the ideal resistor has a value equal to an equivalent series resistance (ESR) of the capacitor, and wherein the ideal inductor has a value equal to an equivalent series inductance (ESL) of the capacitor.
FIG. 2 is a graph of the logarithm of the magnitude of the electrical impedance (Z) between the terminals of the electrical model of FIG. 1 versus the logarithm of frequency f.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
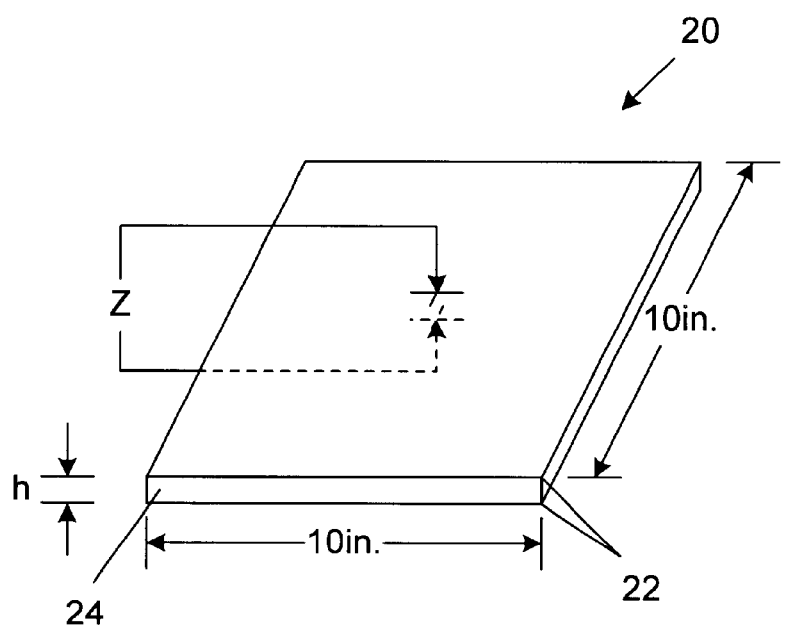
FIG. 3 is a perspective view of a structure including a pair of 10 in.×10 in. square conductive planes separated by a dielectric layer having a dimension or height h between the conductive planes.

FIG. 3 is a perspective view of a structure 20 including a pair of 10 in.×10 in. square conductive planes 22 separated by a fiberglass-epoxy composite dielectric layer 24 having a height h. Each conductive plane 22 is made of copper and is about 0.0014 in. thick. Dielectric layer 24 is made of FR4 dielectric material having a dielectric constant of about 4.0, and height h is approximately 0.002 in.

Figure 4:
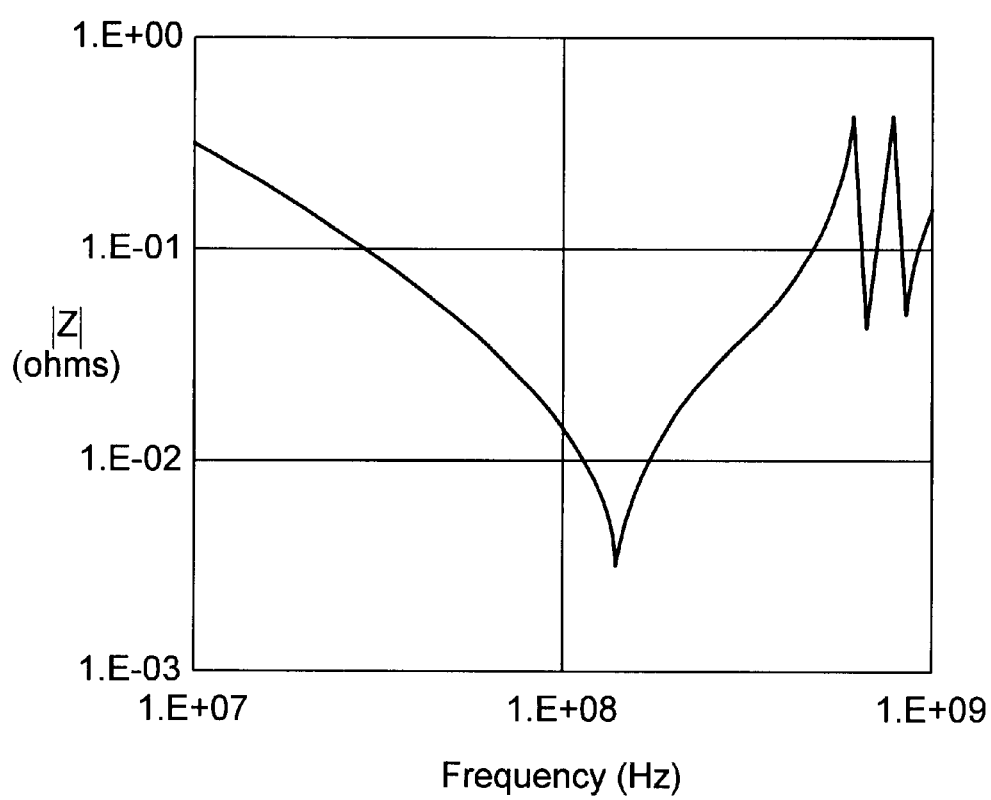
FIG. 4 is a graph of the simulated magnitude of electrical impedance (Z) of the structure of FIG. 3 between the pair of rectangular conductive planes versus frequency.

FIG. 4 is a graph of the simulated magnitude of electrical impedance (Z) of structure 20 of FIG. 3 between the pair of rectangular conductive planes 22 versus frequency. The graph was created by modeling each half-inch square of the pair of conductive planes 22 as a matrix of transmission lines. The impedance value was computed by simulating the application of a 1 ampere constant current between the centers of planes 22, varying the frequency of the current, and determining the magnitude of the steady state voltage between the centers of planes 22.

As shown in FIG. 4, the magnitude of the electrical impedance between conductive planes 22 of FIG. 3 varies widely at frequencies above about 500 MHz. Conductive planes 22 exhibit multiple electrical resonances at frequencies between about 150 MHz and 1 GHz, resulting in alternating high and low impedance values. Conductive planes 22 would be poor candidates for power and ground planes of an electrical interconnecting apparatus (e.g., a PCB) conveying signals having significant frequency content above 500 MHz as the high impedance values of conductive planes 22 at frequencies above 500 MHz would cause relatively large power supply voltage perturbations.

Figure 5:
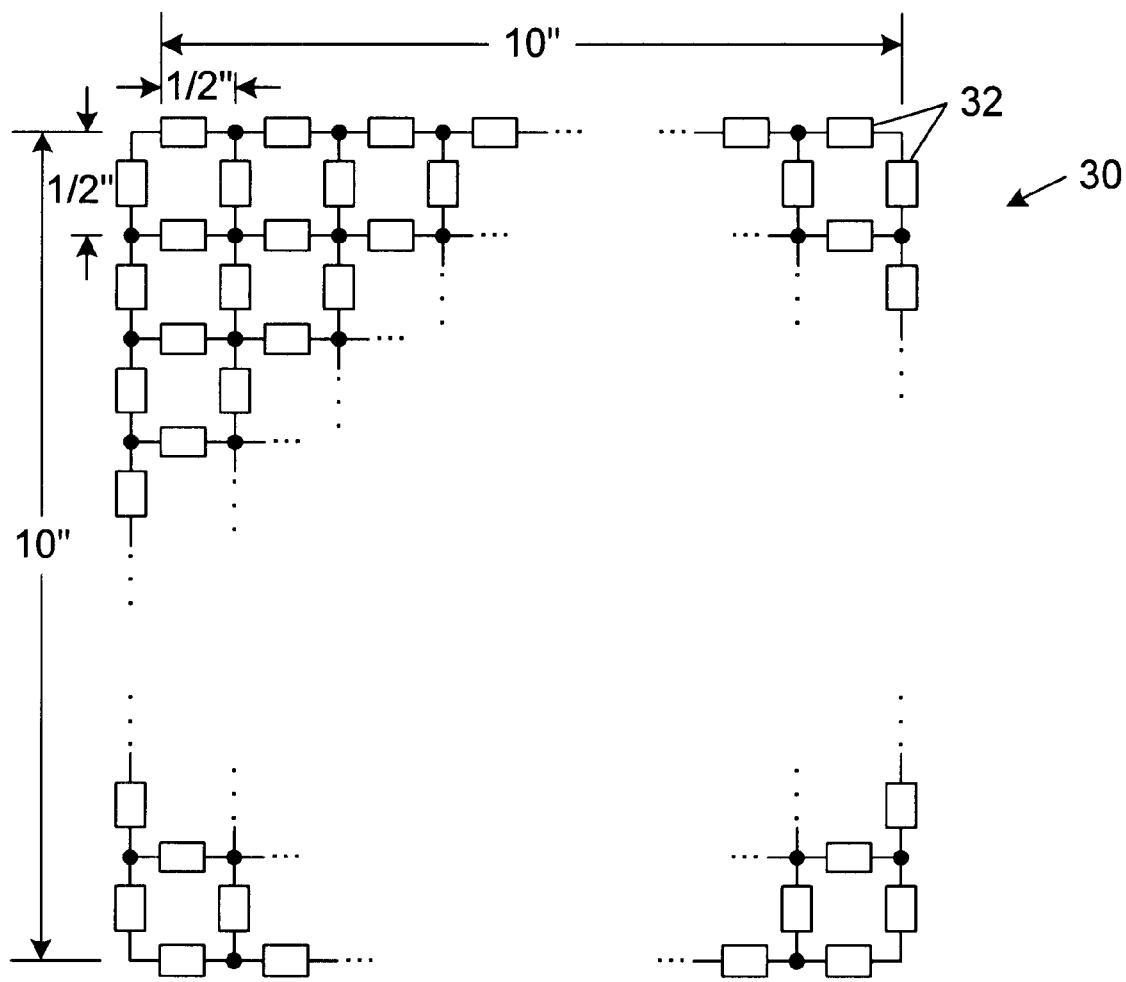
FIG. 5 is a top plan view of a model used to model the structure of FIG. 3, wherein the model is a two-dimensional network of multiple lossy transmission line segments.

FIG. 5 is a top plan view of a model 30 used to model structure 20 of FIG. 3. Model 30 is a two-dimensional network of multiple lossy transmission line segments 32 interconnected to form a 0.5 in. grid pattern. Lossy transmission line segments 32 account for resistive and skin losses in conductors and dielectric losses in dielectric layer 24.

Figure 6:
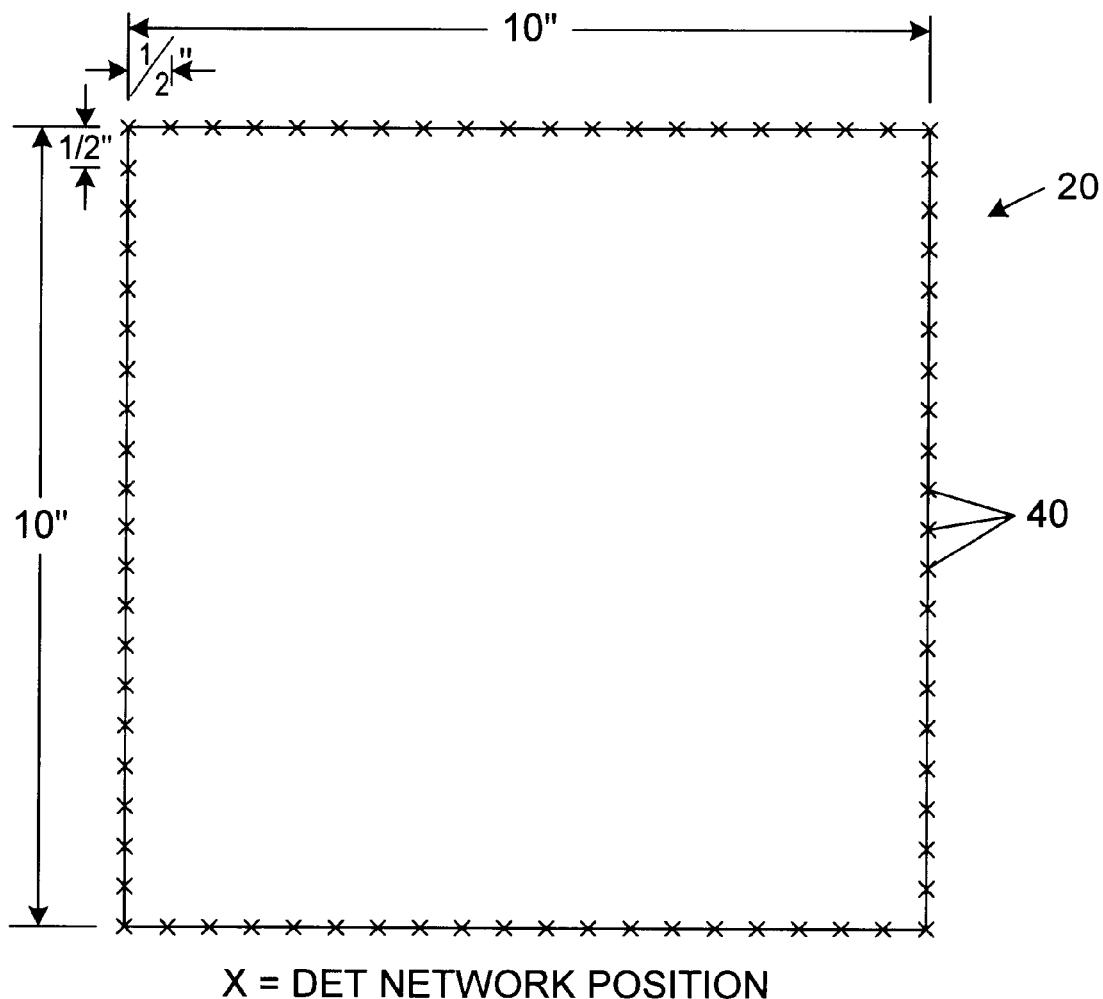
FIG. 6 is a top plan view of the structure of FIG. 3 illustrating the positions of multiple dissipative edge termination (DET) networks used to reduce or completely eliminate electrical resonances in the structure at relatively high frequencies due to open boundaries, wherein the DET networks are coupled between the planes about outer edges of the structure, and wherein each DET network includes a 1 nF capacitor in series with a 1.06 ohm resistor.

FIG. 6 is a top plan view of structure 20 of FIG. 3 illustrating the positions of multiple dissipative edge termination (DET) networks 40 coupled between planes 22 about outer edges of structure 20. Each DET network 40 includes a 1 nF capacitor in series with a 1.06 ohm resistor. Adjacent DET networks 40 are separated by spacing distances of approximately 0.5 in. about outer edges of structure 20. It is noted that DET networks 40 are used only to reduce or completely eliminate electrical resonances in structure 20 at relatively high frequencies due to open boundaries, and are not considered part of a distributed matched bypassing system and method described herein.

Figure 7:
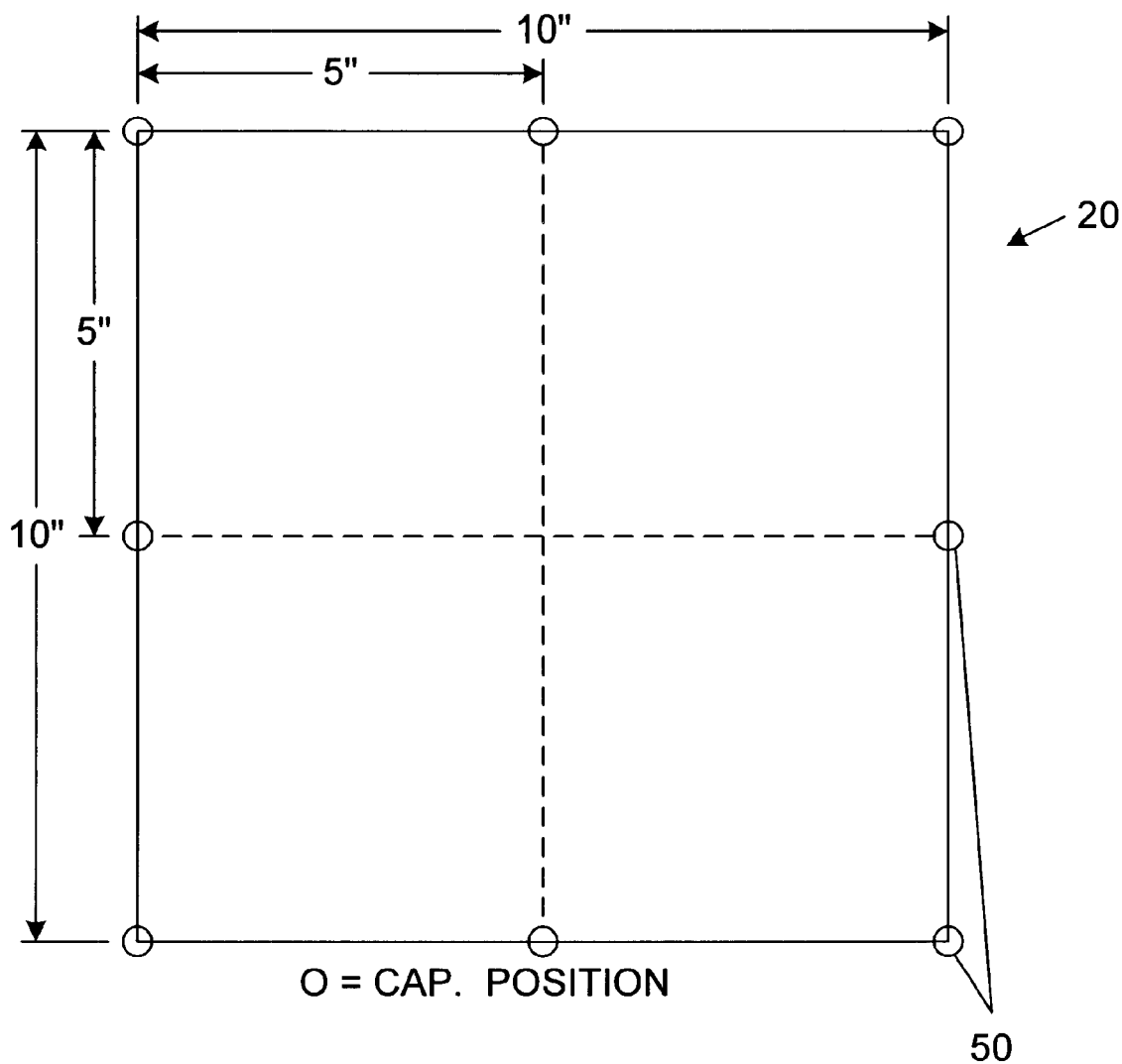
FIG. 7 is a top plan view of the structure of FIG. 3 illustrating the positions of multiple capacitors coupled between the planes about outer edges of the structure as part of a distributed matched bypassing system, wherein all of the capacitors have substantially identical electrical characteristics, and wherein adjacent capacitors are separated by substantially equal spacing distances.

FIG. 7 is a top plan view of structure 20 of FIG. 3 illustrating the positions of multiple capacitors 50 coupled between planes 22 about outer edges of structure 20 as part of a distributed matched bypassing system. All capacitors 50 have substantially the same values of capacitance, ESR, and ESL. Adjacent capacitors 50 are separated by spacing distances of approximately 5.0 in. about outer edges of structure 20 as indicated in FIG. 7.

Figure 8:
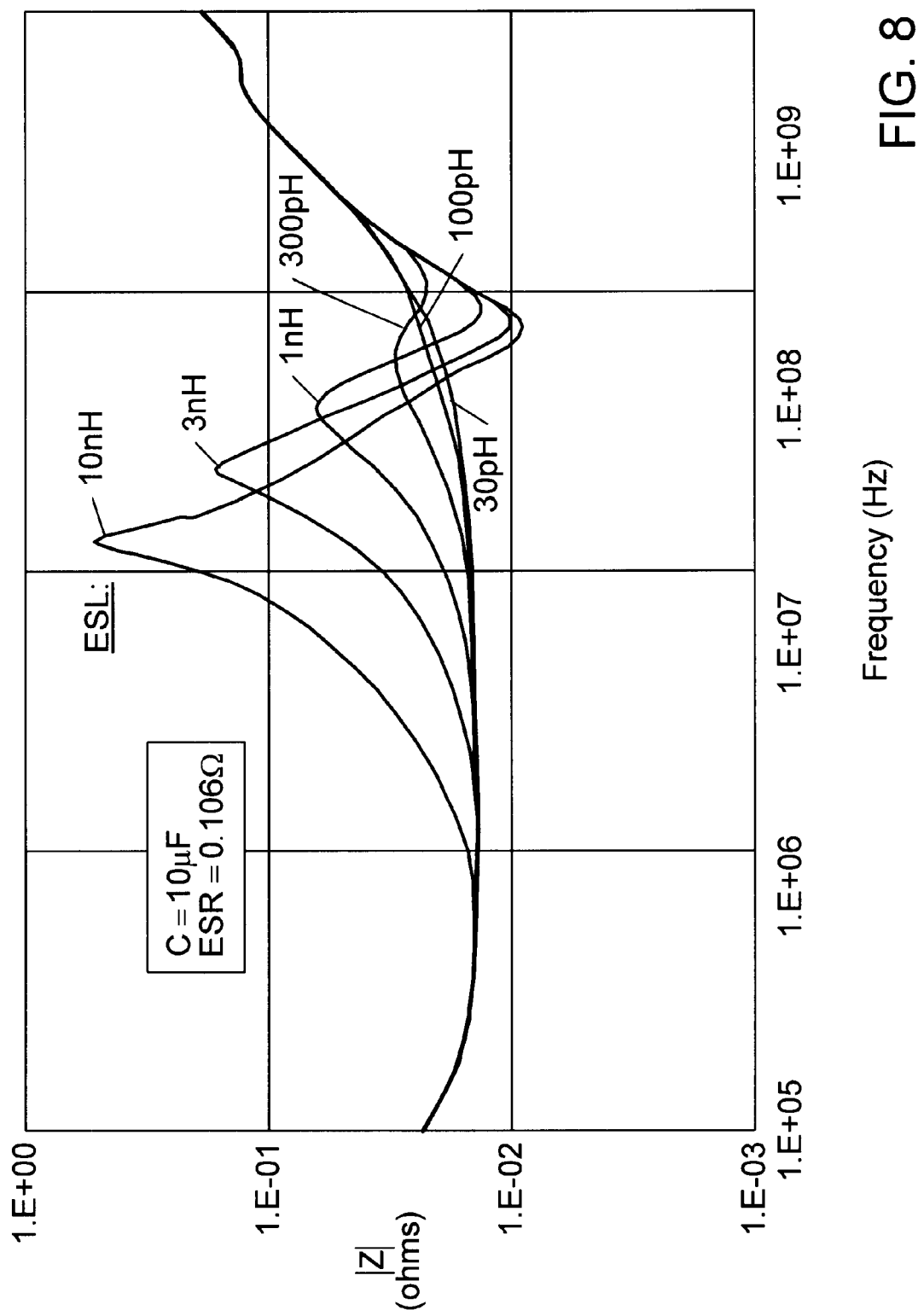
FIG. 8 is a graph of the simulated magnitude of the electrical impedance (Z) of the composite structure of FIGS. 3, 6, and 7 (i.e., the structure of FIG. 3 with the DET networks of FIG. 6 and the capacitors of FIG. 7) versus frequency for several different ESL values of the capacitors of FIG. 7, wherein the capacitors of FIG. 7 have a capacitance C of 10 $\mu$F and an ESR of 0.106 ohms.

FIG. 8 is a graph of the simulated magnitude of the electrical impedance (Z) of the composite structure 20 of FIGS. 3, 6, and 7 (structure 20 of FIG. 3 with DET networks 40 of FIG. 6 and capacitors 50 of FIG. 7) versus frequency for capacitors 50 having several different values of ESL, wherein the capacitance C of all capacitors 50 is 10 μF, and wherein the ESR values of all capacitors 50 is 0.106 ohms. The impedance values were computed by simulating the application of a 1 ampere constant current between the centers of planes 22, varying the frequency of the current, and determining the magnitude of the steady state voltage between the centers of planes 22.

The graph of FIG. 8 shows that for the 8 capacitors 50 having ESL values of 30 pH and 100 pH, the magnitude of Z is approximately equal to ESR/8 or 0.013 ohms over a relatively wide range of frequencies, and the impedance curves are relatively smooth in comparison to the other impedance curves. On the other hand, the impedance curves for capacitors 50 having ESL values greater than 100 pH show increasing amounts of ripple.

Figure 9:
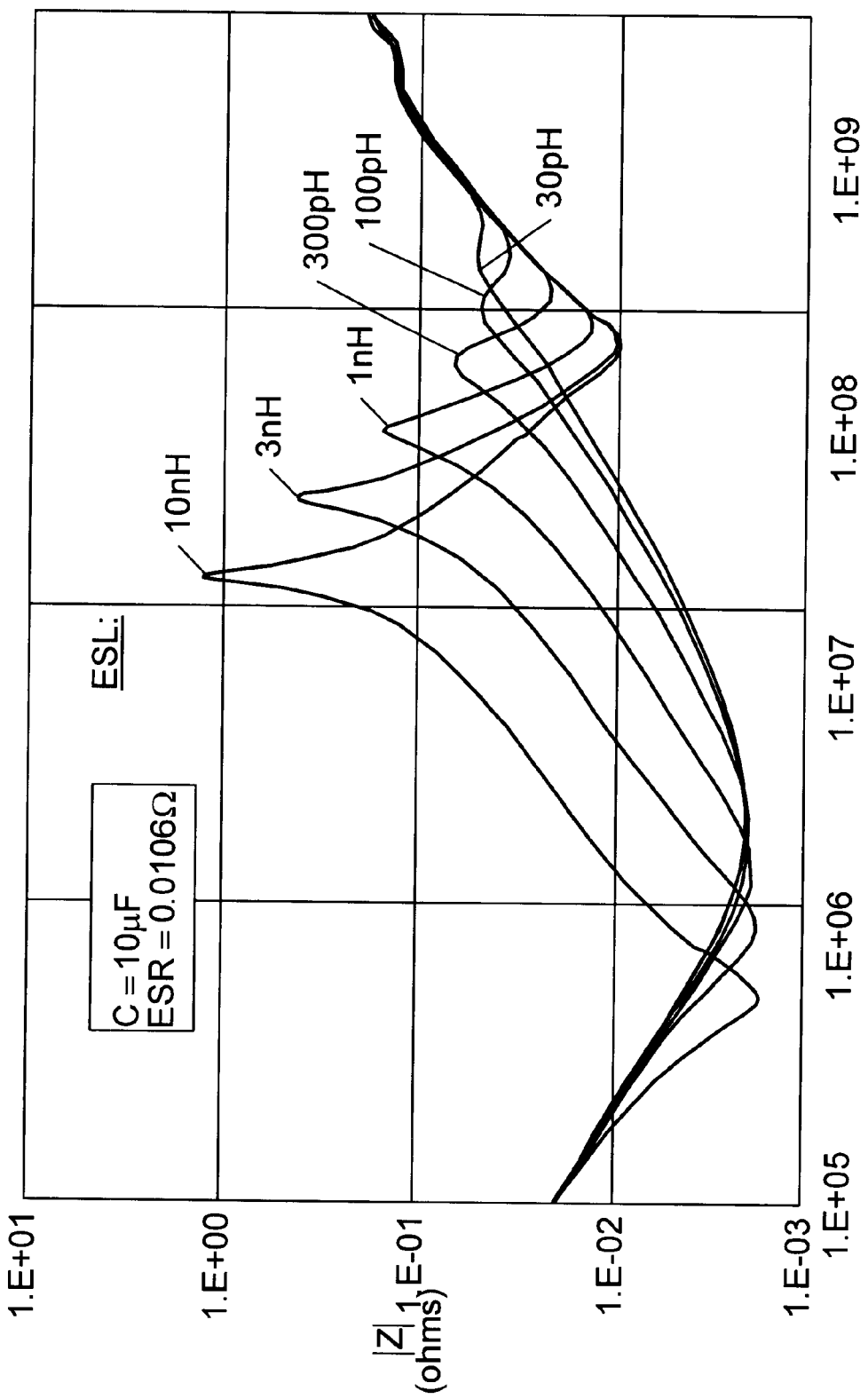
FIG. 9 is a graph of the simulated magnitude of the electrical impedance (Z) of the composite structure of FIGS. 3, 6, and 7 (i.e., the structure of FIG. 3 with the DET networks of FIG. 6 and the capacitors of FIG. 7) versus frequency for several different ESL values of the capacitors of FIG. 7, wherein the capacitors of FIG. 7 have a capacitance C of 10 $\mu$F and an ESR of 0.0106 ohms.

FIG. 9 is a graph of the simulated magnitude of the electrical impedance (Z) of the composite structure 20 of FIGS. 3, 6, and 7 (structure 20 of FIG. 3 with DET networks 40 of FIG. 6 and capacitors 50 of FIG. 7) versus frequency for capacitors 50 having several different values of ESL, wherein the capacitance C of all capacitors 50 is 10 μF, and wherein the ESR values of all capacitors 50 is 0.0106 ohms. Again, the impedance values were computed by simulating the application of a 1 ampere constant current between the centers of planes 22, varying the frequency of the current, and determining the magnitude of the steady state voltage between the centers of planes 22.

The graph of FIG. 9 shows that for capacitors 50 with relatively low ESR (i.e., high Q), there is significant ripple in the impedance curve for even the lowest ESL value of 30 pH. The ripple increases the magnitude of Z above about 150 MHz.

Figure 10:
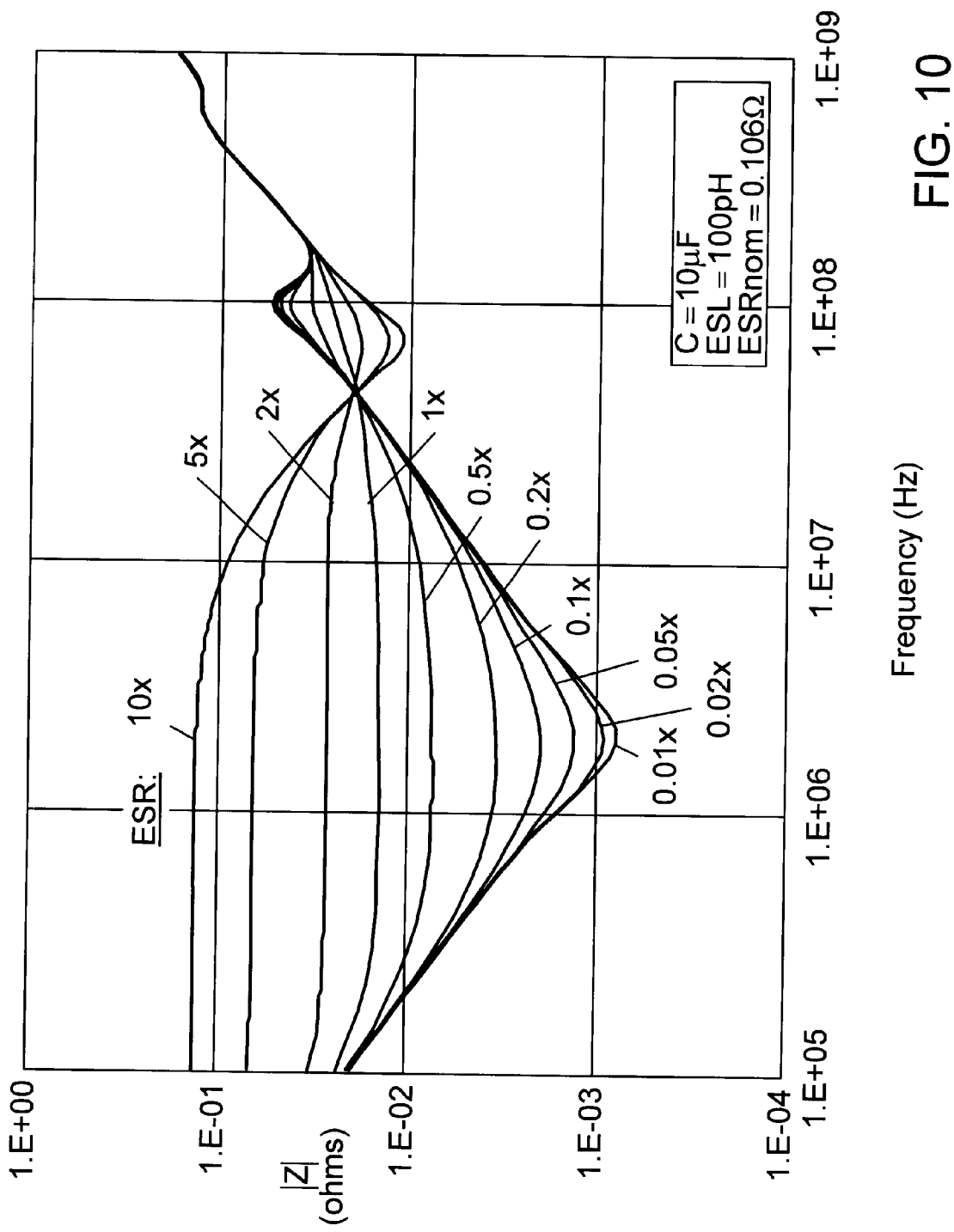
FIG. 10 is a graph of the simulated magnitude of the electrical impedance (Z) of the composite structure of FIGS. 3, 6, and 7 (i.e., the structure of FIG. 3 with the DET networks of FIG. 6 and the capacitors of FIG. 7) versus frequency for several different ESR values of the capacitors of FIG. 7, wherein the capacitors of FIG. 7 have a capacitance C of 10 $\mu$F and an ESL of 100 pH.

FIG. 10 is a graph of the simulated magnitude of the electrical impedance (Z) of the composite structure 20 of FIGS. 3, 6, and 7 (structure 20 of FIG. 3 with DET networks 40 of FIG. 6 and capacitors 50 of FIG. 7) versus frequency for capacitors 50 having several different values of ESR, wherein the capacitance C of all capacitors 50 is 10 μF, and wherein the ESL of all capacitors 50 is 100 pH. For example, in FIG. 10, the 1x impedance curve was generated using an ESR value of 1x a nominal ESR value of 0.106 ohms. Again, the impedance values were computed by simulating the application of a 1 ampere constant current between the centers of planes 22, varying the frequency of the current, and determining the magnitude of the steady state voltage between the centers of planes 22.

The graph of FIG. 10 shows that for capacitors 50 with ESR values below the 1x (0.106 ohm) optimum, the magnitude of Z decreases with increasing frequency and reaches a minimum at series resonant frequencies around 2 MHz. In addition, a peak develops at about 100 MHz at a higher than optimum magnitude of Z. The optimum, the smoothest impedance curve, is achieved when the parallel resultant of the ESR values of all 8 capacitors 50 (ESR/8) equals the characteristic impedance of structure 20.

Manufacturers typically report values of capacitor ESR and ESL measured in isolation. On the other hand, in generating the graphs of FIGS. 8–10 via simulation, each capacitor 50 coupled between parallel planar conductors 22 was assumed to have an equivalent series resistance ESR and an equivalent series inductance ESL in series with a capacitance. In applying conclusions drawn from the graphs of FIGS. 8–10 to real capacitors electrically coupled between parallel power planes of a PCB, the ESR value used in the simulation represents a mounted resistance $R_m$ of the capacitors including, in addition to the ESR, the electrical resistances of all conductors used to couple the capacitors to the power planes of the PCB. Similarly, the ESL value used in the simulation represents a mounted inductance $L_m$ resulting from the coupling of the capacitor structures between the parallel power planes of the PCB. It is noted that for reasons described below, the mounted inductance $L_m$ of a multi-player ceramic capacitor may actually be less than the ESL of the capacitor measured in isolation and reported by the manufacturer.

Figure 11:
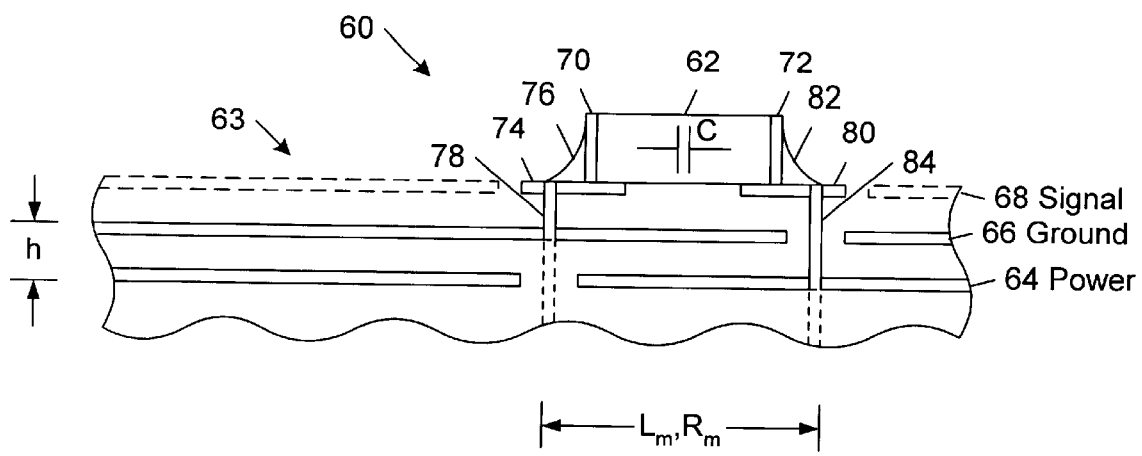
FIG. 11 is a cross sectional view of a portion of an electrical power distribution structure wherein a capacitor (e.g., a multilayer ceramic capacitor) is electrically coupled between a planar power conductor (i.e., a power plane) and a planar ground conductor (i.e., a ground plane) of an interconnecting apparatus, wherein terminals of the capacitor are coupled to solder lands formed within a signal plane of the interconnecting apparatus, and wherein the signal plane is adjacent to the ground plane, and wherein the solder lands are coupled to the power plane and the ground plane by vias.

FIG. 11 will now be used to describe the mounted resistance $R_m$ and the mounted inductance $L_m$ of an exemplary capacitor coupled between parallel power planes. FIG. 11 is a cross sectional view of a portion 60 of an electrical power distribution structure wherein a capacitor 62 (e.g., a multilayer ceramic capacitor) is electrically coupled between a planar power conductor (i.e., a power plane) 64 and a planar ground conductor (i.e., a ground plane) 66 of an interconnecting apparatus 63. Capacitor 62 may be, for example, a bypass capacitor. Interconnecting apparatus 63 may be, for example, a PCB, a component of a semiconductor device package, or formed upon a surface of an integrated circuit substrate.

Interconnecting apparatus 63 includes multiple layers of planar electrical conductors separated by dielectric layers. In the embodiment of FIG. 11, capacitor 62 has two terminals 70 and 72 on opposite ends of a body or package. Terminal 70 is electrically connected to a first solder land 74 by a solder fillet 76. Solder land 74 is electrically coupled to ground plane 66 by a via 78. Terminal 72 is electrically connected to a second solder land 80 by a solder fillet 82. Solder land 80 is electrically coupled to power plane 64 by a via 84.

Solder lands 74 and 80 are formed within a signal plane 68 of interconnecting apparatus 63. Signal plane 68 includes multiple signal lines (i.e., interconnects or traces) used to convey signals within interconnecting apparatus 63.

During use of interconnecting apparatus 63, power plane 64 is connected to a power terminal of an electrical power supply at a power entry point of interconnecting apparatus 63, and ground plane 66 is connected to a ground terminal of the power supply at the power entry point. Power plane 64 and ground plane 66 provide electrical power to electronic devices connected between power plane 64 and ground plane 66.

Via 78 and solder land 74 electrically couple terminal 70 of capacitor 62 to ground plane 66. Similarly, via 84 and solder land 80 electrically couple terminal 72 of capacitor 62 to power plane 64. Mounted inductance $L_m$ of capacitor 62 is given by:

$$L_m = L_{LAND1} + L_{VIA1} + L_C + L_{VIA2} + L_{LAND2}$$

where $L_{LAND1}$ is the inductance of solder land 74, $L_{VIA1}$ is the inductance of via 78, $L_C$ is the inductance of the combination of signal plane 68 and ground plane 66 between via 78 and via 84 due to a length of the capacitor 62 package, $L_{VIA2}$ is the inductance of via 84, and $L_{LAND2}$ is the inductance of solder land 80.

Mounted resistance $R_m$ of capacitor 62 is given by:

$$R_m = ESR + R_{LAND1} + R_{VIA1} + R_C + R_{VIA2} + R_{LAND2}$$

where ESR is the equivalent series resistance of capacitor 62, $R_{LAND1}$ is the resistance of solder land 74, $R_{VIA1}$ is the resistance of via 78, $R_C$ is the resistance power plane 64 between via 78 and via 84 due to the length of the capacitor 62 package, $R_{VIA2}$ is the resistance of via 84, and $R_{LAND2}$ is the resistance of solder land 80.

Figure 12:
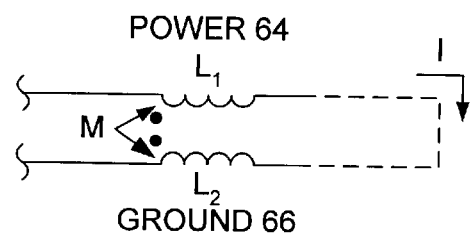
FIG. 12 is an electrical model used to estimate an electrical inductance $L_C$ of the capacitor of FIG. 11, wherein the electrical inductance $L_C$ is the inductance between the signal plane and the ground plane between the vias due to a length of the capacitor body or package.

FIG. 12 is an electrical model 90 used to estimate electrical inductance $L_C$, the inductance of the combination of signal plane 68 and ground plane 66 between via 78 and via 84 due to a length of the capacitor 62 package.

In FIG. 12, $L_1$ represents the self inductance of signal plane 68 between via 78 and via 84, and $L_2$ represents the self inductance of ground plane 66 between via 78 and via 84. Signal plane 68 and ground plane 66, in close proximity to one another, are magnetically coupled to one another, producing a mutual inductance M, where M is given by:

$$M = k\sqrt{L_1 L_2}$$

and k is the coefficient of magnetic coupling between signal plane 68 and ground plane 66.

As indicated in FIG. 12, a current I flows through signal plane 68 and ground plane 66 in opposite directions. Summing the electrical inductances in model 90 around the current loop first along signal plane 68 and then along ground plane 66:

$$L_c = L_1 - M + L_2 - M, \text{ or}$$

$$L_c = L_1 + L_2 - 2M.$$

Assuming $L_1 = L_2 = L$ and using the formula for M given above:

$$L_c = 2L(1-k)$$

where k is the coefficient of magnetic coupling between signal plane 68 and ground plane 66.

It is noted that obtainable values of $L_C$ range from 0.3 to 0.6 nH for multilayer ceramic (MLC) capacitors with relatively small dimensions, and from 0.5 to 2.0 µH for larger MLC capacitors. A portion of these ranges may be lower than ESL values for capacitors measured in isolation and reported by manufacturers.

Figure 13:
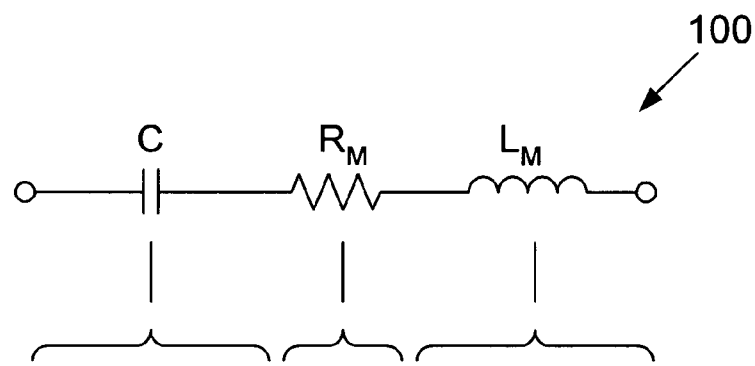
FIG. 13 is a diagram of an electrical model of a bypass capacitor coupled between parallel power planes, wherein the electrical model includes an ideal capacitor, an ideal resistor, and an ideal inductor in series between two terminals of the bypass capacitor, and wherein the ideal capacitor has a value C equal to a capacitance of the bypass capacitor, and wherein the ideal resistor has a value equal to a mounted resistance $R_m$ of the bypass capacitor, and wherein the ideal inductor has a value equal to a mounted inductance $L_m$ of the bypass capacitor.

FIG. 13 is a diagram of an electrical model 100 of a bypass capacitor coupled between parallel power planes. Electrical model 100 is valid over a range of frequencies including a resonant frequency $f_{res}$ of the bypass capacitor. The electrical model includes an ideal capacitor, an ideal resistor, and an ideal inductor in series between two terminals of the bypass capacitor. The ideal capacitor has a value C equal to a capacitance of the bypass capacitor. The ideal resistor has a value equal to a mounted resistance $R_m$ of the bypass capacitor. The mounted resistance $R_m$ of the bypass capacitor is the sum of the ESR of the bypass capacitor and the electrical resistances of all conductors coupling the bypass capacitor to the parallel power planes. The ideal inductor of the electrical model has a value equal to a mounted inductance $L_m$ of the bypass capacitor. The mounted inductance $L_m$ of the bypass capacitor is the electrical inductance resulting from the coupling of the bypass capacitor between the parallel power planes of the PCB. The series combination of the capacitance C and the mounted inductance $L_m$ of the bypass capacitor results in series resonance and a mounted resonant frequency $f_{m-res}$ given by:

$$f_{m-res} = \frac{1}{2\pi\sqrt{(L_m)(C)}}.$$

Figure 14:
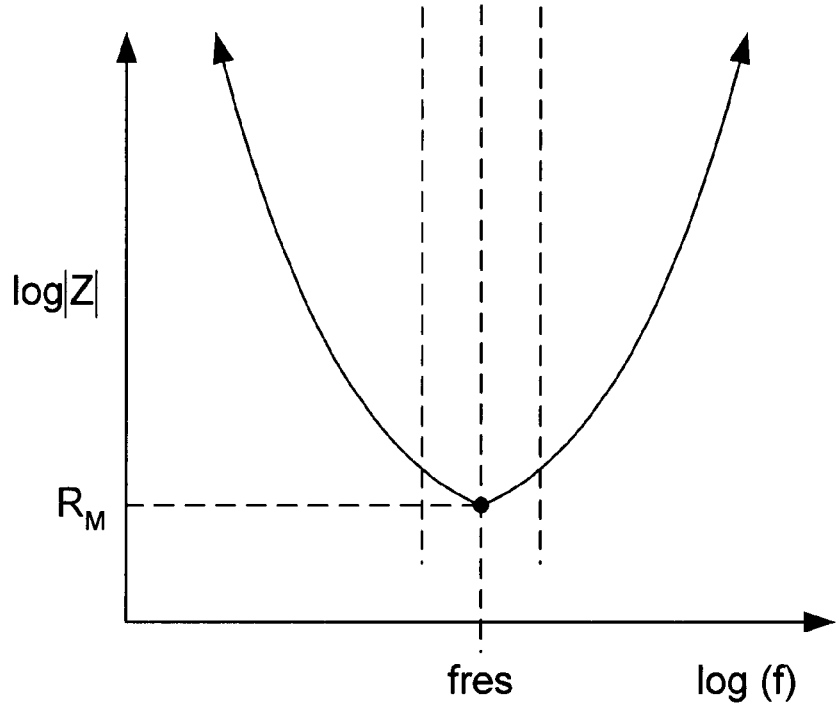
FIG. 14 is a graph of the logarithm of the magnitude of the electrical impedance (Z) between the terminals of the electrical model of FIG. 13 versus the logarithm of frequency f.

FIG. 14 is a graph of the logarithm of the magnitude of the electrical impedance (Z) between the terminals of electrical model 100 versus the logarithm of fequency f. At frequencies flower than mounted resonant frequency $f_{m-res}$, the impedance of electrical model 100 is dominated by the capacitance, and the magnitude of Z decreases with increasing frequency f At the resonant frequency $f_{m-res}$ of the capacitor, the magnitude of Z is a minimum and equal to the mounted resistance $R_m$ of the capacitor. Within a range of frequencies centered about resonant frequency $f_{m-res}$, the impedance of electrical model 100 is dominated by the mounted resistance $R_m$, and the magnitude of Z is substantially equal to the mounted resistance $R_m$ of the capacitor. At frequencies f greater than resonant frequency $f_{m-res}$, the impedance of electrical model 100 is dominated by the mounted inductance $L_m$, and the magnitude of Z increases with increasing frequency f.

Conclusions drawn from FIGS. 8–10 regarding bypass capacitor selection will now be presented in terms of mounted resistance $R_m$ and mounted inductance $L_m$ of multiple bypass capacitors. Bypass capacitor mounted resistance $R_m$ will first be considered. Referring to FIG. 10, the 8 capacitors 50, each having the same series resistance value and coupled between conductive planes 22 of structure 20 (FIG. 7), produced an impedance between conductive planes 22 having a magnitude approximately equal to the series resistance value of capacitors 50 divided by 8. The impedance magnitude was substantially constant over a relatively wide range of frequencies, and the impedance curve was relatively smooth in comparison to the other impedance curves. Thus, to achieve a target impedance $Z_t$ between a pair of parallel planar conductors, a number of bypass capacitors n (n≧2) should be selected having a mounted resistance $R_m$ such that:

$$R_m = n \cdot Z_t.$$

Bypass capacitor mounted inductance $L_m$ will now be considered. The inductance $L_p$ of a pair of conductive planes having target impedance $Z_t$ and separated by a distance or height h is given by:

$$L_p = (\mu_0 \cdot h)$$

where $\mu_0$ is the permeability of free space. It is noted that this equation is still true when the conductive planes are separated by a dielectric layer as dielectric materials used to form dielectric layers are typically non-magnetic, and thus the relative permeability $\mu_r$ of such a dielectric layer is assumed to be unity. FIGS. 8 and 9 can be used to show that smooth impedance curves result when the equivalent inductance of 8 capacitors 50 coupled in parallel between conductive planes 22 ($L_m/8$) is much less than the inductance $L_p$ of conductive planes 22. Additional simulations were used to determine that smooth impedance curves result when the equivalent inductance of the 8 capacitors 50 coupled in parallel between conductive planes 22 ($L_m/8$) is less than or equal to about 20 percent of the inductance $L_p$ of conductive planes 22. Thus, to achieve target impedance $Z_t$ between the pair of parallel planar conductors, the n bypass capacitors should be selected having a mounted inductance $L_m$ such that:

$$L_m \leq (0.2 \cdot n \cdot L_p)$$

The required number of bypass capacitors n will now be considered. The required number of bypass capacitors n may depend upon whether or not the bypass capacitors will be used to suppress plane resonances. A first value for the required number of bypass capacitors $n_1$ may be calculated by: (i) determining the mounted inductance $L_m$ of each of the bypass capacitors, and (ii) substituting the mounted inductance $L_m$ in the following equation:

$$n_1 = \frac{L_m}{(0.2 \cdot L_p)}.$$

If the bypass capacitors are not intended for suppression of plane resonances, the required number of bypass capacitors n is equal to the first value $n_1$. The n bypass capacitors may be dispersed across a surface of one or both of the planar conductors and electrically coupled between the planar conductors.

On the other hand, if the bypass capacitors will be used to suppress plane resonances, at least a portion of the bypass capacitors will be electrically coupled between the planar conductors along an outer edge of the planar conductors. In this situation, it is necessary to calculate a second value for the required number of bypass capacitors $n_2$.

In order to suppress plane resonances, adjacent bypass capacitors coupled along an outer edge of the planar conductors should be separated by a spacing distance much less than a wavelength of a highest frequency of interest. For example, the planar conductors may be part of an electrical power distribution structure of an electrical interconnecting apparatus (e.g., a PCB). Electrical signals conveyed within the electrical interconnecting apparatus have an associated frequency range and a maximum frequency $f_{max}$ of the frequency range. The wavelength of maximum frequency $f_{max}$ is the velocity divided by the frequency. If the dielectric layer between the planar conductors has a relative permittivity of $\epsilon_r$, the velocity is the speed of light c (about $3.0 \times 10^8$ m/sec) divided by the square root of $\epsilon_r$. Adjacent bypass capacitors coupled along the outer edge of the planar conductors may be separated by a spacing distance less than or equal to a maximum spacing distance $S_{max}$ may be given by:

$$S_{max} = 0.1 \cdot \left( \frac{c}{f_{max} \cdot \sqrt{\epsilon_r}} \right).$$

The second value for the required number of bypass capacitors $n_2$ is calculated using:

$$n_2 = \frac{d_p}{S_{max}}$$

where $d_p$ is the distance around the outer edges of the planar conductors. If $n_2 \geq n_1$, the required number of bypass capacitors n is equal to $n_2$, and all of the capacitors will be coupled between the planar conductors along the outer edge of the planar conductors. On the other, if $n_1 > n_2$, the required number of bypass capacitors n is equal to $n_1$, and only $n_2$ of the capacitors will be coupled between the planar conductors along the outer edge of the planar conductors. The remaining ($n_1 - n_2$) capacitors may be dispersed across a surface of one or both of the planar conductors and electrically coupled between the planar conductors.

Figure 15:
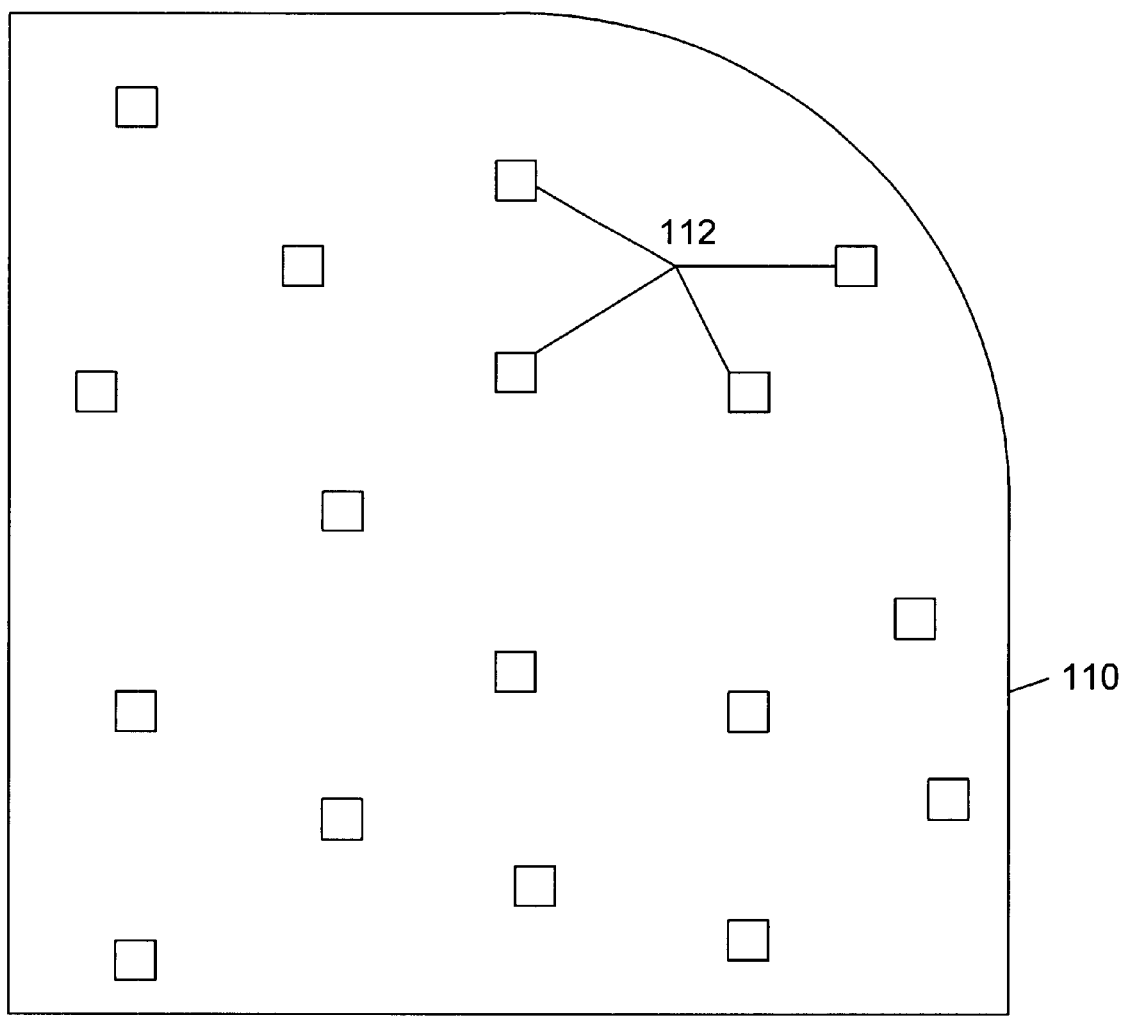
FIG. 15 is a top plan view of an exemplary electrical interconnecting apparatus including a pair of parallel planar conductors, wherein multiple discrete bypass capacitors are located upon, and distributed about, an upper surface of the interconnecting apparatus, and wherein each of the bypass capacitors is coupled between the planar conductors.

FIG. 15 is a top plan view of an exemplary electrical interconnecting apparatus 110 including a pair of parallel planar conductors, wherein multiple discrete bypass capacitors 112 are located upon, and distributed about, a surface of the one of the planar conductors, and wherein each of the bypass capacitors 112 is electrically coupled between the planar conductors. As described above, the arrangement of bypass capacitors 112 in FIG. 15 may be adopted when bypass capacitors 112 are not to be used to suppress resonances of the planar conductors. It is noted that the bypass capacitors 112 may be located upon, and distributed about, surfaces of both of the planar conductors.

Figure 16:
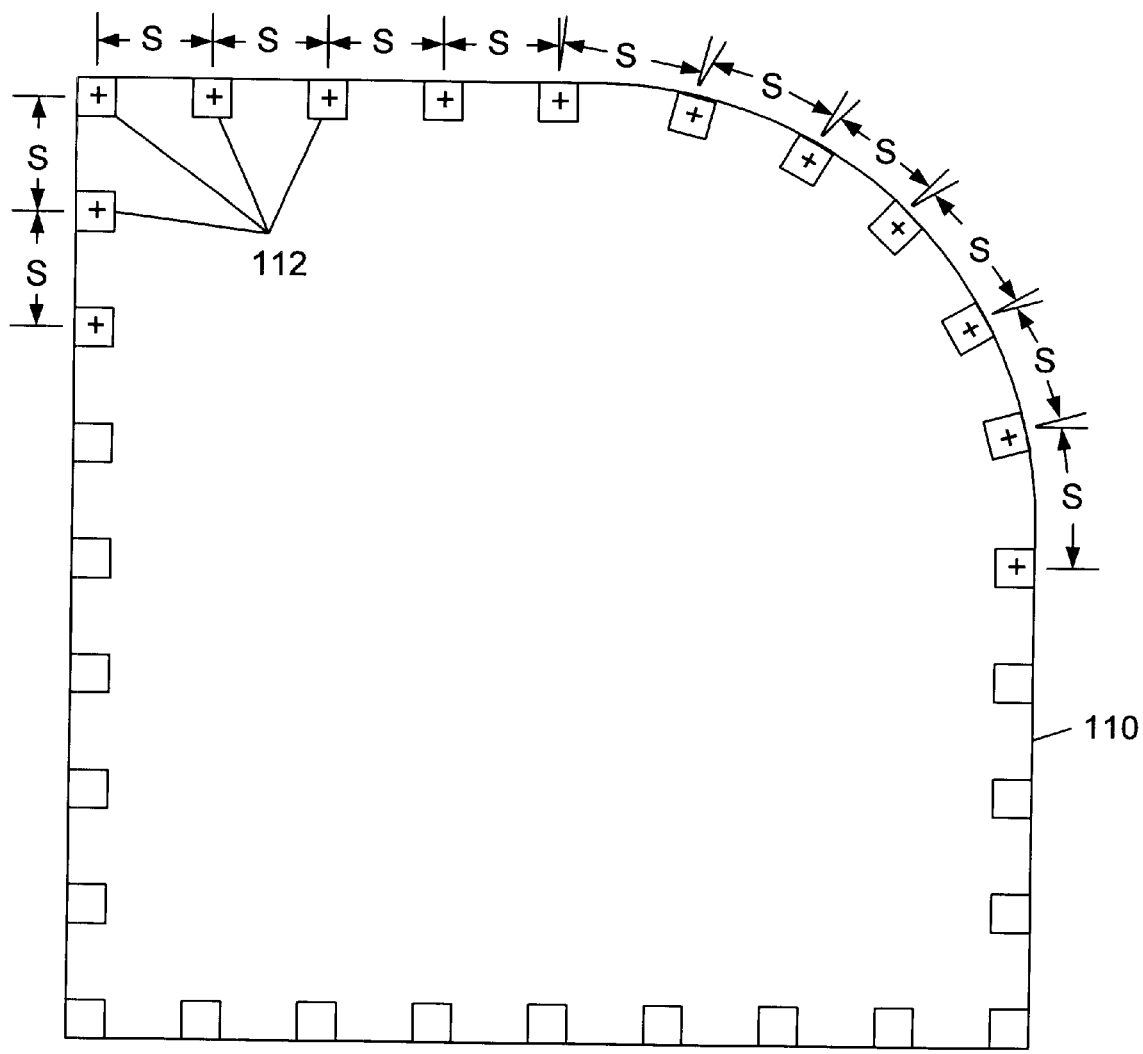
FIG. 16 is a top plan view of the interconnecting apparatus of FIG. 15, wherein the multiple discrete bypass capacitors are electrically coupled between the planar conductors along corresponding outer edges of the planar conductors, and wherein adjacent bypass capacitors are separated by a spacing distance S.

FIG. 16 is a top plan view of the exemplary interconnecting apparatus 110 of FIG. 15, wherein the multiple discrete bypass capacitors 112 are electrically coupled between the planar conductors along corresponding outer edges of the planar conductors. In FIG. 16, adjacent bypass capacitors are separated by a spacing distance S, where $S \geq S_{max}$. As described above, the arrangement of bypass capacitors 112 in FIG. 16 may be adopted when bypass capacitors 112 are to be used to suppress resonances of the planar conductors. It is noted that the bypass capacitors 112 may be positioned along a portion of the corresponding outer edges of the planar conductors.

Calculation of the electrical impedance between a pair of parallel conductive planes separated by a dielectric layer will now be presented. In FIG. 11, interconnecting apparatus 60 includes a planar power conductor (i.e., a power plane) 64 parallel to a planar ground conductor (i.e., a ground plane) 66. Power plane 64 and ground plane 66 are separated by a dielectric layer having a vertical height h. An empirical formula for the electrical impedance Zp between a structure including a pair of parallel conductive planes separated by a dielectric layer (e.g., power plane 64 and ground plane 66 of interconnecting apparatus 60) is:

$$Z_p(\Omega) = \frac{(0.532)(h)}{(\sqrt{\epsilon_r})(d_p)}$$

where h is the distance (e.g., a height) between the planes in mils (where 1 mil=0.001 inch), $\epsilon_r$ is the relative permittivity of the dielectric layer, and $d_p$ is the distance around the outer edges (e.g., an outer perimeter) of the structure in inches.

The above formula may also be used to determine the electrical impedance Zp of a structure including multiple pairs of parallel conductive planes separated by dielectric layers. In this situation, h is an equivalent distance (e.g., a height) between a representative single pair of planes in mils. In general, for a structure having n pairs of parallel conductive planes separated by dielectric layers:

$$h = \frac{1}{\sum_{i=1}^{n} \frac{1}{h_i}}$$

where $h_i$ is the distance (e.g., height) between the ith pair of the n pairs.

Figure 17:
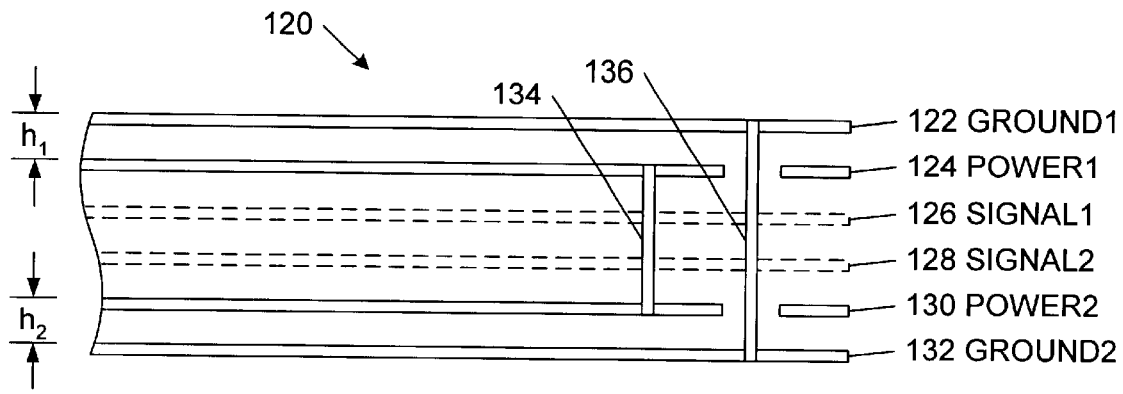
FIG. 17 is a cross sectional view of a portion of one embodiment of an electrical interconnecting apparatus including a power distribution structure having two different pairs of conductive power planes, wherein the interconnecting apparatus includes two signal planes between the pairs of power planes.
Figure 18:
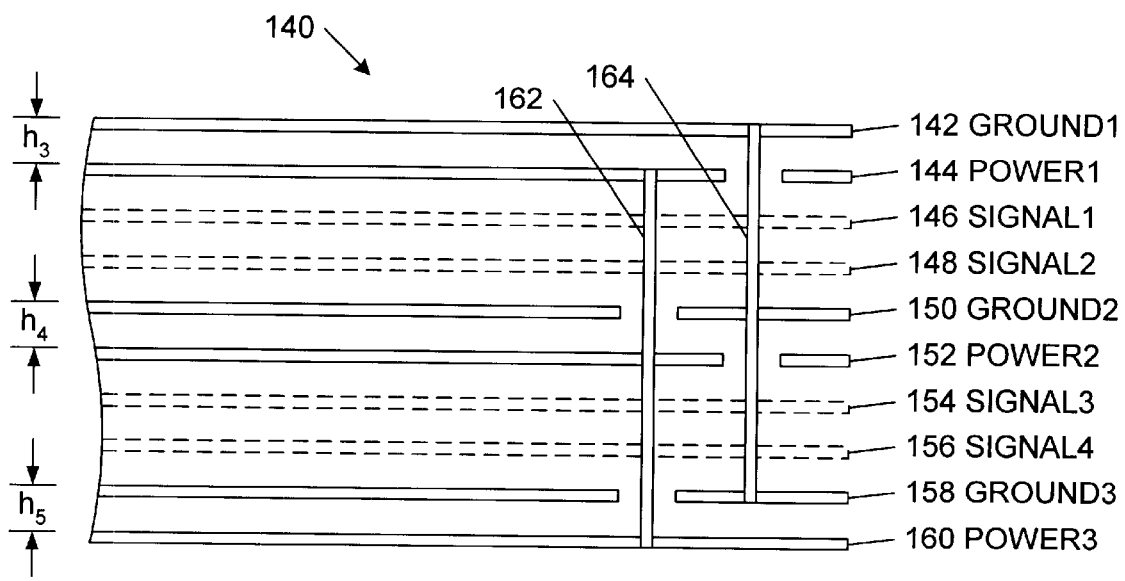
FIG. 18 is a cross sectional view of a portion of one embodiment of an electrical interconnecting apparatus including a power distribution structure having three different pairs of conductive power planes, wherein the interconnecting apparatus includes two signal planes between a first and a second of the three pairs of power planes, and two more signal planes between the second and the third of the three pairs of power planes.

FIGS. 17 and 18 will now be used to illustrate exemplary interconnect apparatus and how an effective distance (e.g., height) h may be calculated for power distribution structures of the interconnect apparatus. FIG. 17 is a cross sectional view of a portion of one embodiment of an electrical interconnecting apparatus 120 including a power distribution structure having two different pairs of conductive power planes. Interconnecting apparatus 120 includes a GROUND1 plane 122 and a POWER1 plane 124 forming one of the pairs of conductive power planes, a SIGNAL1 plane 126, a SIGNAL2 plane 128, and a POWER2 plane 130 and a GROUND2 plane 132 forming the other pair of conductive power planes. POWER1 plane 124 and POWER2 plane 130 are coupled by a via 134, and GROUND1 plane 122 and GROUND2 plane 132 are coupled by a via 136. SIGNAL1 plane 126 and SIGNAL2 plane 128 are used to convey electrical signals within interconnecting apparatus 120.

As shown in FIG. 17, GROUND1 plane 122 and POWER1 plane 124 are separated by a height $h_1$, and POWER2 plane 130 and GROLND2 plane 132 are separated by a height $h_2$. For interconnecting apparatus 120 of FIG. 17, h for use in the above equation for calculating the impedance of the power distribution structure is given by:

$$h = \frac{1}{\frac{1}{h_1} + \frac{1}{h_2}}$$

where $h_1$ and $h_2$ are in mils. It is noted that if $h_1=h_2=h_x$, then $h=h_x/2$.

FIG. 18 is a cross sectional view of a portion of one embodiment of an electrical interconnecting apparatus 140 including a power distribution structure having three different pairs of conductive power planes. Interconnecting apparatus 140 includes a GROUND1 plane 142 and a POWER1 plane 144 forming a first of the three pairs of conductive power planes, a SIGNAL1 plane 146, a SIGNAL2 plane 148, a GROUND2 plane 150 and a POWER2 plane 152 forming a second of three pairs of conductive power planes, a SIGNAL3 plane 154, a SIGNAL4 plane 156, and a GROUND3 plane 158 and a POWER3 plane 160 forming the third pair of conductive power planes. POWER1 plane 144, POWER2 plane 152, and POWER3 plane 160 are coupled by a via 162, and GROUND1 plane 142, GROUND2 plane 150, and GROUND3 plane 158 are coupled by a via 164. SIGNAL1 plane 146, SIGNAL2 plane 148, SIGNAL3 plane 154, and SIGNAL4 plane 156 are used to convey electrical signals within interconnecting apparatus 140.

As shown in FIG. 18, GROUND1 plane 142 and POWER1 plane 144 are separated by a height $h_3$, POWER2 plane 152 and GROUND2 plane 150 are separated by a height $h_4$, and POWER3 plane 160 and GROUND3 plane 158 are separated by a height $h_5$. For interconnecting apparatus 140 of FIG. 18, h for use in the above equation for calculating the impedance of the power distribution structure is given by:

$$h = \frac{1}{\frac{1}{h_3} + \frac{1}{h_4} + \frac{1}{h_5}}$$

where $h_3$, $h_4$, and $h_5$ are in mils. It is noted that if $h_3=h_4=h_5=h_y$, then $h=h_y/3$.

As illustrated in FIG. 10, the smoothest impedance curve for a pair of parallel conductive planes separated by a dielectric layer is achieved when the parallel resultant of the ESR values of all n bypass capacitors (ESR/n) coupled between the pair of parallel conductive planes is equal to the characteristic impedance of the pair of parallel conductive planes. As described above, a separation distance h between the parallel conductive planes may be determined in order to achieve a target electrical impedance $Z_t$. The target electrical impedance $Z_t$ may then be used to determine a required value of mounted resistance $R_{m-req}$ for n discrete electrical capacitors (e.g., bypass capacitors):

$$R_{m-req} = n \cdot Z_t.$$

The n discrete electrical capacitors may be selected such that the n capacitors each have an equivalent series resistance (ESR) which is less than or equal to the required value of mounted resistance $R_{m-req}$. Where the ESR of the n capacitors is less than the required value of mounted resistance $R_{m-req}$, an electrical resistance element may be placed in series with each of the n capacitors. In this situation, the mounted resistance $R_m$ of a given one of the n capacitors may include the ESR of the capacitor, an electrical resistance of a corresponding electrical resistance element in series with the capacitor, and the electrical resistances of all conductors coupling the capacitor between the pair of parallel conductive planes.

The electrical resistance value for each of the n electrical resistance elements may be selected such that the mounted resistance $R_m$ of each of the n capacitors is equal to the required value of mounted resistance $R_{m-req}$. This may be accomplished by determining the mounted resistance $R_m$ of a representative one of the n capacitors when coupled between the planar conductors and when the electrical resistance of the corresponding electrical resistance element is zero. In this situation, the mounted resistance $R_m$ of the representative capacitor may be equal to the sum of the ESR of the representative capacitor and the electrical resistances of all conductors coupling the capacitor between the planar conductors. The electrical resistance of each of the n electrical resistance elements may be determined by subtracting the mounted resistance $R_m$ of the representative capacitor from the required value of mounted resistance $R_{m-req}$.

FIGS. 19–25 will now be used to illustrate several embodiments of an electrical power distribution structure including an electrical resistance element coupled in series with a capacitor between a pair of parallel conductive planes separated by a dielectric layer (e.g., between a power plane and a ground plane). In the embodiments of FIGS. 19–25, electrical resistance elements are incorporated in ways which do not appreciably increase physical dimensions of current loops coupling the capacitor between the pair of parallel conductive planes. As a result, the mounted inductance $L_m$ of the capacitor is not changed substantially over a corresponding conventional structure.

Figure 19:
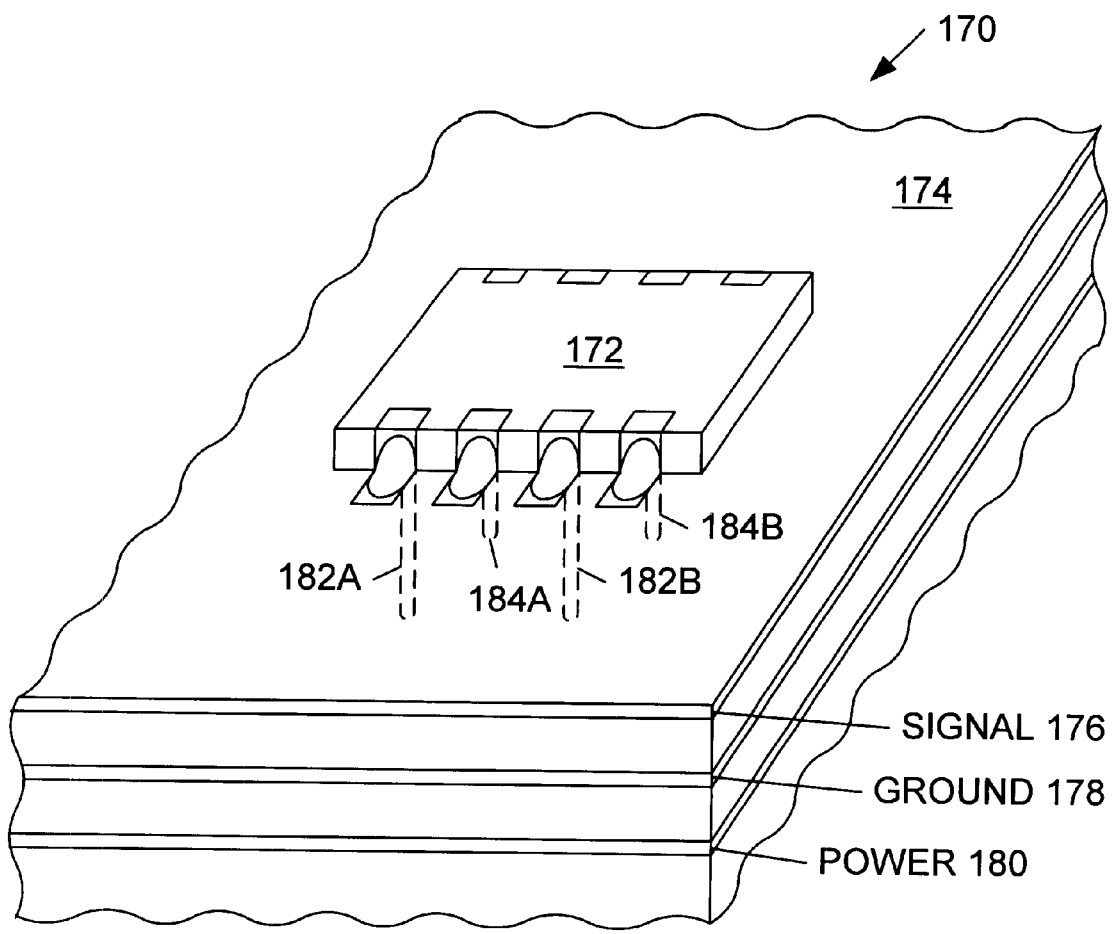
FIG. 19 is a perspective view of a portion of an electrical power distribution structure including a capacitor (e.g., an interdigitated capacitor) mounted upon an upper surface of an interconnecting apparatus and electrically coupled between an electrical power (i.e., power) conductor layer and an electrical ground (i.e., ground) conductor layer of the interconnecting apparatus.

FIG. 19 is a perspective view of a portion 170 of an electrical power distribution structure including a capacitor 172 (e.g., an interdigitated capacitor) mounted upon an upper surface of an interconnecting apparatus 174. Interconnecting apparatus 174 may be, for example, a PCB, a component of a semiconductor device package, or formed upon a surface of an integrated circuit substrate.

Interconnecting apparatus 174 includes a signal conductor layer 176, an electrical ground (i.e., ground) conductor layer 178, and an electrical power (i.e., power) conductor layer 180. Capacitor 172 has a body and multiple power and ground terminals positioned along opposite side surfaces of the body. The power and ground terminals alternate along the sides of the body. A total of 8 vias are used to couple capacitor 172 between power conductor layer 180 and ground conductor layer 178. Vias 182A and 182B of FIG. 1 are used to connect corresponding power terminals of capacitor 172 to a portion of power conductor layer 180. Vias 184A and 184B of FIG. 1 are connected corresponding ground terminals of capacitor 172 to ground conductor layer 178. Two other vias on a side of capacitor 172 opposite vias 182A, 182B, 184A, and 184B are used to couple corresponding power terminals of capacitor 172 to power conductor layer 180. An additional two vias on the opposite side of capacitor 172 are used to connect corresponding ground terminals of capacitor 172 to ground conductor layer 178. The multiple parallel current paths formed between power conductor layer 180 and ground conductor layer 178 through capacitor 172 reduce a mounted inductance of capacitor 172.

Figure 20:
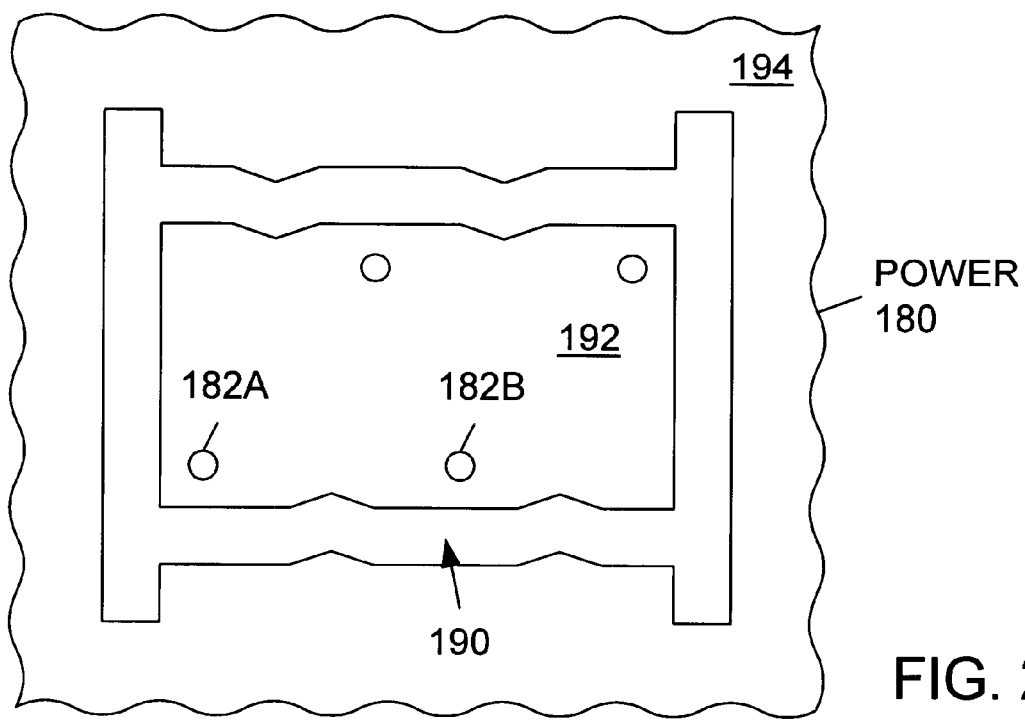
FIG. 20 is a top plan view of one embodiment of the power conductor layer of FIG. 19 following a process (e.g., an etch process) during which a portion of an electrically conductive material (e.g., a metal) forming the power conductor layer is removed from an isolation region, thereby forming an island electrically isolated from a remainder of the power conductor layer.

FIG. 20 is a top plan view of one embodiment of power conductor layer 180 of FIG. 19 following a process (e.g., an etch process) during which a portion of an electrically conductive material (e.g., a metal) forming power conductor layer 180 is removed from an isolation region 190, thereby forming an island 192 electrically isolated from a remainder 194 of power conductor layer 180.

Figure 21:
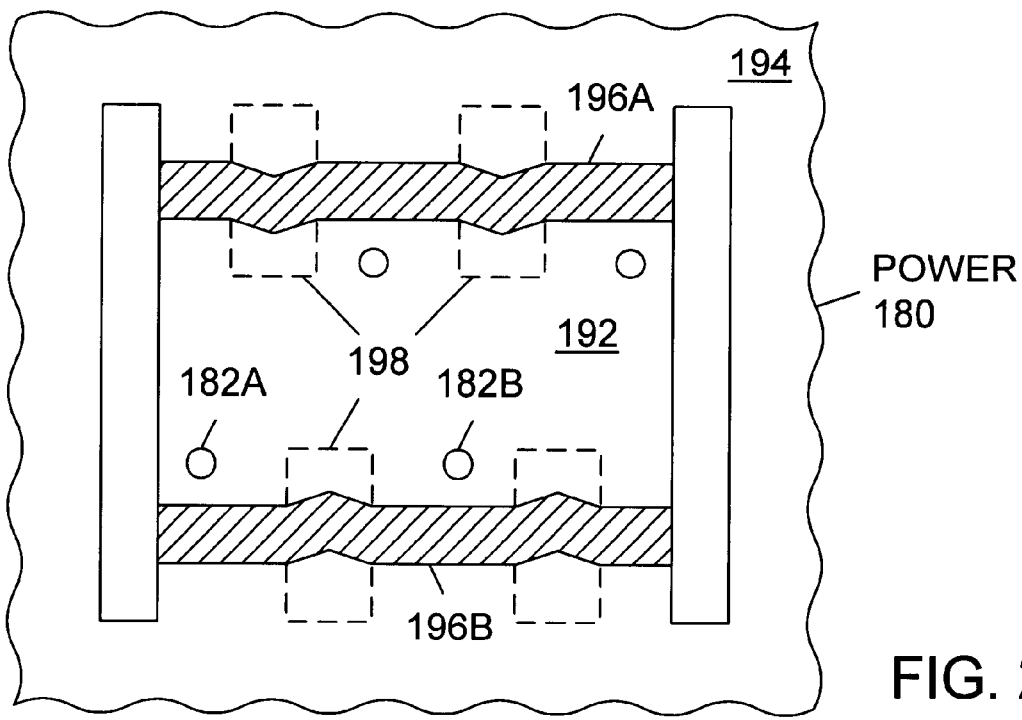
FIG. 21 is a top plan view of the embodiment of the power conductor layer of FIG. 20 following a process during which two resistive stripes are formed between the island and the remainder of the power conductor layer on opposite sides of the island, wherein the capacitor of FIG. 19 and an electrical resistance offered by the two resistive stripes of FIG. 21 are coupled in series between the power conductor layer and the ground conductor layer of the interconnecting apparatus of FIG. 19.

FIG. 21 is a top plan view of the embodiment of power conductor layer 180 of FIG. 20 following a process during which two resistive stripes 196A and 196B are formed between island 192 and remainder 194 of power conductor layer 180. In the embodiment of FIG. 21, resistive stripes 196A and 196B are formed in portions of isolation region 190 on opposite sides of island 192.

During use of interconnecting apparatus 174 (FIG. 19), an electrical power supply voltage is impressed between remainder 194 of power conductor layer 180 and ground conductor layer 178. Connected between island 192 and ground conductor layer 178 by the 8 vias, capacitor 172 presents an electrical capacitance between island 192 and ground conductor layer 178. Resistive stripes 196A and 196B resistively couple island 192 to remainder 194 of power conductor layer 180. Resistive stripes 196A and 196B, electrically in parallel between island 192 and remainder 194 of power conductor layer 180, present a single value of resistance between island 192 and remainder 194 of power conductor layer 180. The electrical resistance presented by resistive stripes 196A and 196B and the electrical capacitance of capacitor 172 are coupled in series between remainder 194 of power conductor layer 180 and ground conductor layer 178, forming a series resistance-capacitance (RC) network between remainder 194 of power conductor layer 180 and ground conductor layer 178.

Resistive stripes 196A and 196B are formed from electrically resistive materials (e.g., resistive inks). Resistive stripes 196A and 196B each present an electrical resistance between island 192 and remainder 194 of power conductor layer 180. The magnitudes of the resistances presented by resistive stripes 196A and 196B depend upon the physical dimensions of respective resistive stripes 196A and 196B. The magnitudes of the resistances presented by resistive stripes 196A and 196B are also dependent upon the electrical resistivities of the electrically resistive materials used to form respective resistive stripes 196A and 196B.

In the embodiment of FIG. 21, multiple anchor regions 198 exist in power conductor layer 180 along perimeters of remainder 194 and island 192 adjacent to the portions of isolation region 190 where resistive stripes 196A and 196B are formed. Each anchor region includes a protrusion extending outwardly from a perimeter of remainder 194 toward island 192 and a correspondingly-shaped recess in an adjacent perimeter of island 192. Anchor regions 198 help keep resistive stripes 196A and 196B in place despite any lateral shear forces which may be exerted upon resistive stripes 196A and 196B during assembly of interconnecting apparatus 174.

In the embodiment of FIG. 21, resistive stripes 196A and 196B are formed from a material having an electrical resistivity higher than that of the electrically conductive material (e.g., a metal) removed from power conductor layer 180 to form isolation region 190. As a result, a mounted resistance $R_m$ of capacitor 172 is increased over a corresponding conventional structure. It is noted that a mounted inductance $L_m$ of capacitor 172 would not be expected to change substantially over the corresponding conventional structure as the physical dimensions of the current path through capacitor 172 are substantially unchanged over the corresponding conventional structure.

Capacitor 172 may be, for example, one of n capacitors coupled between power conductor layer 180 and ground conductor layer 178 to stabilize the electrical impedance of the electrical distribution structure including power conductor layer 180 and ground conductor layer 178. A target electrical impedance $Z_t$ may be used to determine a required value of mounted resistance $R_{m-req}$ for the n capacitors according to:

$$R_{m-req} = n \cdot Z_t.$$

Capacitor 172 may have an ESR which is less than the required value of mounted resistance $R_{m-req}$. In this situation, the electrical resistance value offered by resistive stripes 196A and 196B in parallel may be selected such that the mounted resistance $R_m$ of capacitor 172 is equal to the required value of mounted resistance $R_{m-req}$. This may be accomplished by determining the mounted resistance $R_m$ of capacitor 172 when the electrical resistance value offered by resistive stripes 196A and 196B in parallel is zero. The mounted resistance $R_m$ of capacitor 172 when the electrical resistance value offered by resistive stripes 196A and 196B in parallel is zero may be equal to the sum of the ESR of capacitor 172 and the electrical resistances of all conductors coupling capacitor 172 between the planar conductors. The electrical resistance value offered by resistive stripes 196A and 196B in parallel may be determined by subtracting the mounted resistance $R_m$ of capacitor 172 when the electrical resistance value offered by resistive stripes 196A and 196B in parallel is zero from the required value of mounted resistance $R_{m-req}$.

Figure 22:
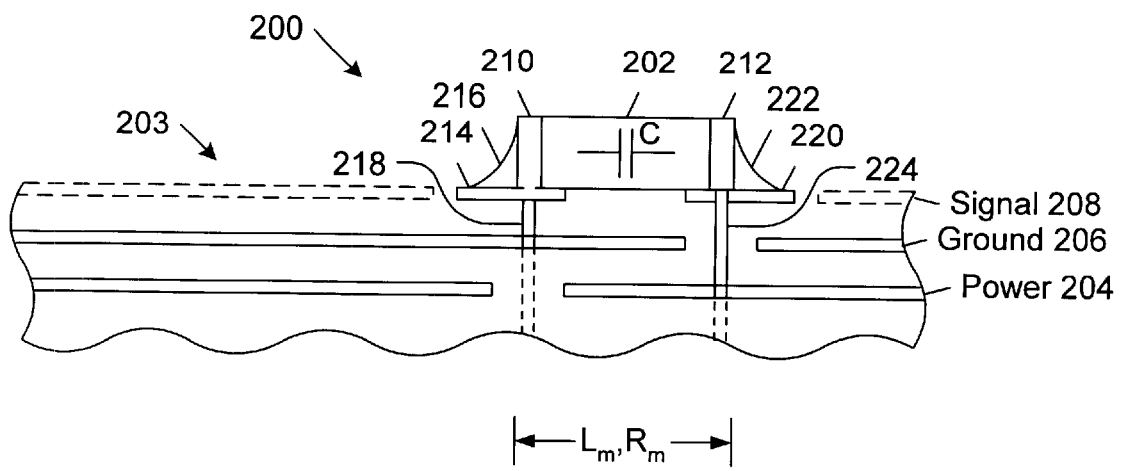
FIG. 22 is a cross sectional view of a portion of an electrical power distribution structure wherein vias with relatively high electrical resistances are used to electrically couple a capacitor (e.g., a multilayer ceramic capacitor) between a planar power conductor (i.e., a power plane) and a planar ground conductor (i.e., a ground plane) of an interconnecting apparatus.

FIG. 22 is a cross sectional view of a portion 200 of an electrical power distribution structure wherein vias with relatively high electrical resistances are used to electrically couple a capacitor 202 (e.g., a multilayer ceramic capacitor) between a planar power conductor (i.e., a power plane) 204 and a planar ground conductor (i.e., a ground plane) 206 of an interconnecting apparatus 203. Capacitor 202 may be, for example, a bypass capacitor. Interconnecting apparatus 203 may be, for example, a PCB, a component of a semiconductor device package, or formed upon a surface of an integrated circuit substrate.

Interconnecting apparatus 203 includes multiple layers of planar electrical conductors separated by dielectric layers. In the embodiment of FIG. 22, capacitor 202 has two terminals 210 and 212 on opposite ends of a body or package. Terminal 210 is electrically connected to a first solder land 214 by a solder fillet 216. Solder land 214 is electrically coupled to ground plane 206 by a via 218. Terminal 212 is electrically connected to a second solder land 220 by a solder fillet 222. Solder land 220 is electrically coupled to power plane 204 by a via 224.

Solder lands 214 and 220 are formed within a signal plane 208 of interconnecting apparatus 203. Signal plane 208 includes multiple signal lines (i.e., interconnects or traces) used to convey signals within interconnecting apparatus 203. During use of interconnecting apparatus 203, power plane 204 is connected to a power terminal of an electrical power supply at a power entry point of interconnecting apparatus 203, and ground plane 206 is connected to a ground terminal of the power supply at the power entry point. Power plane 204 and ground plane 206 provide electrical power to electronic devices connected between power plane 204 and ground plane 206.

In the embodiment of FIG. 22, vias 218 and 224 are formed from a material having an electrical resistivity higher than that of conventional via-forming materials in order to increase a mounted resistance $R_m$ of capacitor 202. It is noted that the mounted inductance $L_m$ of capacitor 202 would not be expected to change substantially over a corresponding conventional structure as only vias 218 and 224 are modified, and the physical dimensions of the current loop coupling capacitor 202 between power plane 204 and ground plane 206 are not increased substantially over the corresponding conventional structure.

Capacitor 202 may be, for example, one of n capacitors coupled between power plane 204 and ground plane 206 to stabilize the electrical impedance of the electrical distribution structure including power plane 204 and ground plane 206. A target electrical impedance $Z_t$ may be used to determine a required value of mounted resistance $R_{m-req}$ for the n capacitors according to:

$$R_{m-req} = n \cdot Z_t.$$

Capacitor 202 may have an ESR which is less than the required value of mounted resistance $R_{m-req}$. In this situation, the combined electrical resistance values of vias 218 and 224 may be selected such that the mounted resistance $R_m$ of capacitor 202 is equal to the required value of mounted resistance $R_{m-req}$. This may be accomplished by determining the mounted resistance $R_m$ of capacitor 202 when the electrical resistances of vias 218 and 224 are both zero. The mounted resistance $R_m$ of capacitor 202 when the electrical resistances of vias 218 and 224 are both zero may be equal to the sum of the ESR of capacitor 202 and the electrical resistances of all conductors coupling the capacitor between the planar conductors (e.g., the electrical resistances of solder lands 214 and 220, and power plane 204 between via 218 and via 224 due to the length of the capacitor 202 package). The combined electrical resistances of vias 218 and 224 may be determined by subtracting the mounted resistance $R_m$ of capacitor 202 when the electrical resistances of vias 218 and 224 are both zero from the required value of mounted resistance $R_{m-req}$.

Figure 23:
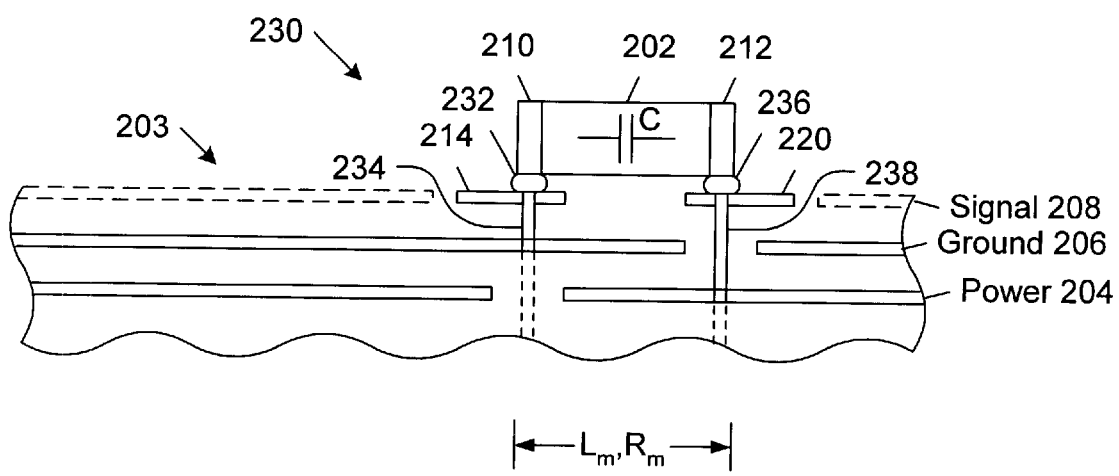
FIG. 23 is a cross sectional view of a portion of an electrical power distribution structure wherein an electrically resistive adhesive material is used to electrically couple a capacitor between a power plane and a ground plane of an interconnecting apparatus.

FIG. 23 is a cross sectional view of a portion 230 of an electrical power distribution structure wherein an electrically resistive adhesive material is used to electrically couple capacitor 202 between power plane 204 and ground plane 206 of interconnecting apparatus 203. Components of the electrical power distribution structure shown in FIG. 22 and described above are labeled similarly in FIG. 23.

In the embodiment of FIG. 23, terminal 210 of capacitor 202 is electrically connected to first solder land 214 by a first amount of an electrically resistive adhesive material 232. Solder land 214 is electrically coupled to ground plane 206 by a via 234. Terminal 212 is electrically connected to a second solder land 220 by a second amount of the electrically resistive adhesive material 236. Solder land 220 is electrically coupled to power plane 204 by a via 238.

In the embodiment of FIG. 23, the first amount of the electrically resistive adhesive material 232 and the second amount of the electrically resistive adhesive material 236 have electrical resistivities higher than that of conventional solder fillets in order to increase mounted resistance $R_m$ of capacitor 202. It is noted that the mounted inductance $L_m$ of capacitor 202 would not be expected to change substantially over a corresponding conventional structure as only the mechanisms for attaching terminals 210 and 212 of capacitor 202 to respective solder lands 214 and 220 are modified, and the physical dimensions of the current loop coupling capacitor 202 between power plane 204 and ground plane 206 are not increased substantially over the corresponding conventional structure.

In the embodiment of FIG. 23, capacitor 202 may be one of n capacitors coupled between power plane 204 and ground plane 206 to stabilize the electrical impedance of the electrical distribution structure including power plane 204 and ground plane 206. A target electrical impedance $Z_t$ may be used to determine a required value of mounted resistance $R_{m-req}$ for the n capacitors according to:

$$R_{m-req} = n \cdot Z_t.$$

Capacitor 202 may have an ESR which is less than the required value of mounted resistance $R_{m-req}$. In this situation, the combined electrical resistance values of the first amount of the electrically resistive adhesive material 232 and the second amount of the electrically resistive adhesive material 236 may be selected such that the mounted resistance $R_m$ of capacitor 202 is equal to the required value of mounted resistance $R_{m-req}$. This may be accomplished by determining the mounted resistance $R_m$ of capacitor 202 when the electrical resistances of the first amount of the electrically resistive adhesive material 232 and the second amount of the electrically resistive adhesive material 236 are both zero. The mounted resistance $R_m$ of capacitor 202 when the electrical resistances of the first amount of the electrically resistive adhesive material 232 and the second amount of the electrically resistive adhesive material 236 are both zero may be equal to the sum of the ESR of capacitor 202 and the electrical resistances of all conductors coupling the capacitor between the planar conductors (e.g., the electrical resistances of solder lands 214 and 220, and power plane 204 between via 234 and via 238 due to the length of the capacitor 202 package). The combined electrical resistances of the first amount of the electrically resistive adhesive material 232 and the second amount of the electrically resistive adhesive material 236 may be determined by subtracting the mounted resistance $R_m$ of capacitor 202 when the electrical resistances of the first amount of the electrically resistive adhesive material 232 and the second amount of the electrically resistive adhesive material 236 are both zero from the required value of mounted resistance $R_{m-req}$.

Figure 24:
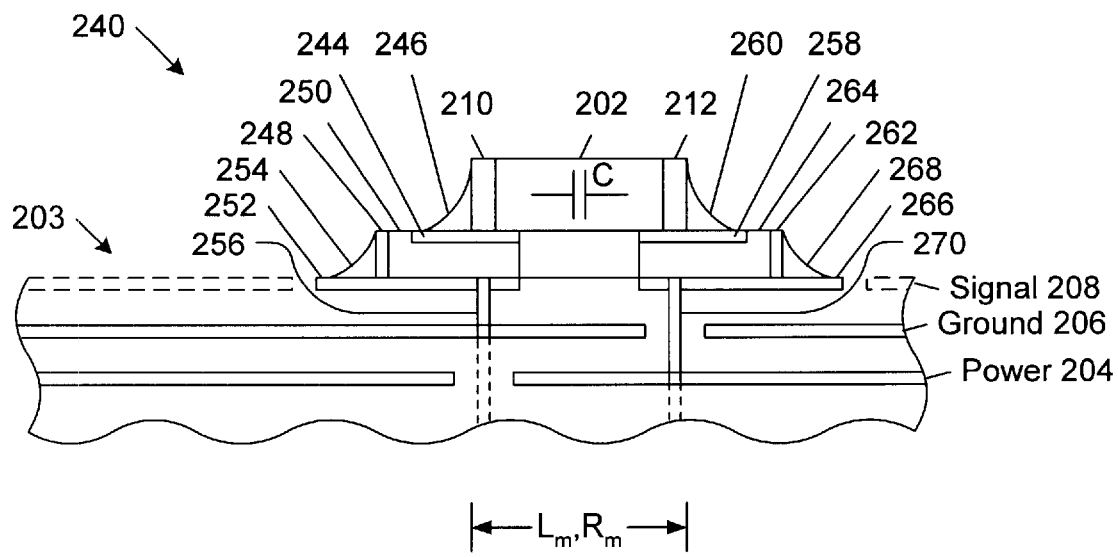
FIG. 24 is a cross sectional view of a portion of an electrical power distribution structure wherein a resistive coupon is positioned between a capacitor and an interconnecting apparatus, and wherein an electrical resistance offered by the resistive coupon is electrically coupled in series with the capacitor between a power plane and a ground plane of the interconnecting apparatus.

FIG. 24 is a cross sectional view of a portion 240 of an electrical power distribution structure wherein a resistive coupon 242 is positioned between capacitor 202 and interconnecting apparatus 203, and wherein an electrical resistance offered by resistive coupon 242 is electrically coupled in series with capacitor 202 between power plane 204 and ground plane 206 of interconnecting apparatus 203. Components of the electrical power distribution structure shown in FIGS. 22–23 and described above are labeled similarly in FIG. 24.

In the embodiment of FIG. 24, terminal 210 of capacitor 202 is electrically connected to a solder land 244 on an upper surface of resistive coupon 242 by a solder fillet 246. Solder land 244 is electrically coupled to a side terminal 248 on a side surface of resistive coupon 242 via a first resistive region 250 of resistive coupon 242. Side terminal 248 of resistive coupon 242 is electrically connected to a solder land 252 of interconnecting apparatus 203 by a solder fillet 254. Solder land 252 of interconnecting apparatus 203 is electrically connected to ground plane 206 by a via 256.

Terminal 212 of capacitor 202 is electrically connected to a solder land 258 on the upper surface of resistive coupon 242 by a solder fillet 260. Solder land 258 is electrically coupled to a side terminal 262, on a side surface of resistive coupon 242 opposite side terminal 248, via a second resistive region 264 of resistive coupon 242. Side terminal 262 of resistive coupon 242 is electrically connected to a solder land 266 of interconnecting apparatus 203 by a solder fillet 268. Solder land 266 of interconnecting apparatus 203 is electrically connected to power plane 204 by a via 270.

In the embodiment of FIG. 24, the first resistive region 250 and the second resistive region 264 of resistive coupon 242 have electrical resistivities higher than that of conventional solder fillets in order to increase mounted resistance $R_m$ of capacitor 202. It is noted that the mounted inductance $L_m$ of capacitor 202 would not be expected to change substantially over a corresponding conventional structure as physical dimensions of resistive coupon 242 may be relatively small, and thus the physical dimensions of the current loop coupling capacitor 202 between power plane 204 and ground plane 206 may not be increased substantially over the corresponding conventional structure.

In the embodiment of FIG. 24, capacitor 202 may be one of n capacitors coupled between power plane 204 and ground plane 206 to stabilize the electrical impedance of the electrical distribution structure including power plane 204 and ground plane 206. As described above, a target electrical impedance $Z_t$ may be used to determine a required value of mounted resistance $R_{m\text{-}req}$ for the n capacitors according to:

$$R_{m\text{-}req} = n \cdot Z_t.$$

Capacitor 202 may have an ESR which is less than the required value of mounted resistance $R_{m\text{-}req}$. In this situation, the combined electrical resistance values of the first resistive region 250 and the second resistive region 264 of resistive coupon 242 may be selected such that the mounted resistance $R_m$ of capacitor 202 is equal to the required value of mounted resistance $R_{m\text{-}req}$. This may be accomplished by determining the mounted resistance $R_m$ of capacitor 202 when the electrical resistances of the first resistive region 250 and the second resistive region 264 are both zero. The mounted resistance $R_m$ of capacitor 202 when the electrical resistances of the first resistive region 250 and the second resistive region 264 are both zero may be equal to the sum of the ESR of capacitor 202 and the electrical resistances of all conductors coupling the capacitor between the planar conductors (e.g., the electrical resistances of solder lands 252 and 266, and power plane 204 between via 256 and via 270 due to the length of the capacitor 202 package). The combined electrical resistances of the first resistive region 250 and the second resistive region 264 may be determined by subtracting the mounted resistance $R_m$ of capacitor 202 when the electrical resistances of the first resistive region 250 and the second resistive region 264 are both zero from the required value of mounted resistance $R_{m\text{-}req}$.

Figure 25A:
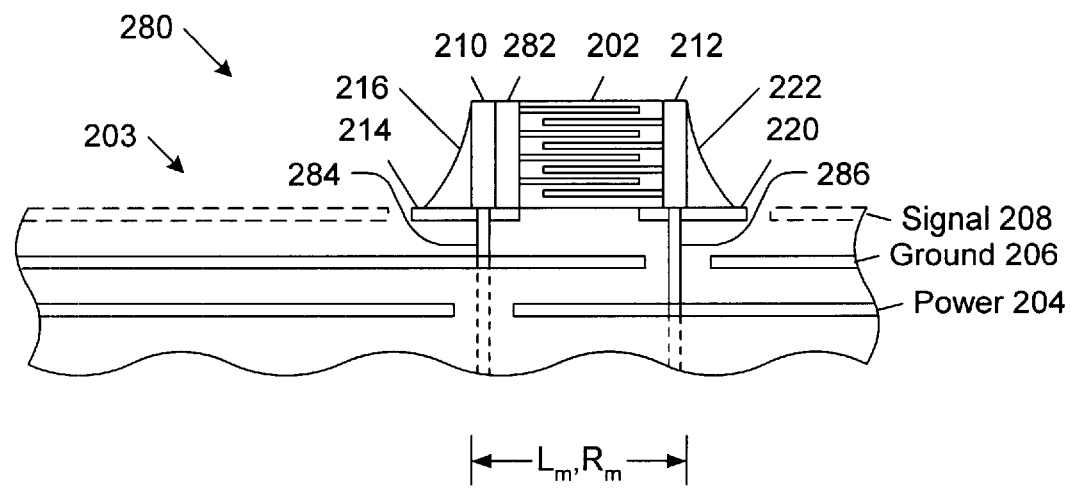
FIG. 25A is a cross sectional view of a portion of an electrical power distribution structure wherein a capacitor is electrically coupled between a power plane and a ground plane of an interconnecting apparatus, and wherein the capacitor includes a single electrical resistance element in series with a capacitance element.

FIG. 25A is a cross sectional view of a portion 280 of an electrical power distribution structure wherein capacitor 202 is electrically coupled between power plane 204 and ground plane 206 of interconnecting apparatus 203, and wherein capacitor 202 includes an electrical resistance element 282 in series with a capacitance element. Components of the electrical power distribution structure shown in FIGS. 22–24 and described above are labeled similarly in FIG. 25A.

In the embodiment of FIG. 25A, in addition to terminals 210 and 212, capacitor 202 includes two interleaved sets of conductive plates arranged in parallel and separated by a dielectric. One of the two sets of conductive plates is electrically connected to terminal 212. The other set of conductive plates is electrically coupled to terminal 210 via internal electrical resistance element 282. Terminal 210 is electrically connected to first solder land 214 by solder fillet 216. Solder land 214 is electrically coupled to ground plane 206 by a via 284. Terminal 212 is electrically connected to second solder land 220 by solder fillet 222. Solder land 220 is electrically coupled to power plane 204 by a via 286.

In the embodiment of FIG. 25A, electrical resistance element 282 is formed from a material having a relatively high electrical resistivity (e.g., higher than that of a metal conductor) in order to increase mounted resistance $R_m$ of capacitor 202. It is noted that the mounted inductance $L_m$ of capacitor 202 would not be expected to change substantially over a corresponding conventional structure as the physical the length of the capacitor 202 package may not be increased significantly. Accordingly, the physical dimensions of the current loop coupling capacitor 202 between power plane 204 and ground plane 206 may not be increased substantially over the corresponding conventional structure.

Capacitor 202 may be one of n capacitors coupled between power plane 204 and ground plane 206 to stabilize the electrical impedance of the electrical distribution structure including power plane 204 and ground plane 206. As described above, a target electrical impedance $Z_t$ may be used to determine a required value of mounted resistance $R_{m\text{-}req}$ for the n capacitors according to:

$$R_{m\text{-}req} = n \cdot Z_t.$$

Capacitor 202 may have an ESR which is less than the required value of mounted resistance $R_{m\text{-}req}$. In this situation, the electrical resistance of electrical resistance element 282 may be selected such that the mounted resistance $R_m$ of capacitor 202 is equal to the required value of mounted resistance $R_{m\text{-}req}$. This may be accomplished by determining the mounted resistance $R_m$ of capacitor 202 when the electrical resistance of electrical resistance element 282 is zero. The mounted resistance $R_m$ of capacitor 202 when the electrical resistance of electrical resistance element 282 is zero may be equal to the sum of the ESR of capacitor 202 and the electrical resistances of all conductors coupling the capacitor between the planar conductors (e.g., the electrical resistances of solder lands 214 and 220, and power plane 204 between via 284 and via 286 due to the length of the capacitor 202 package). The electrical resistance of electrical resistance element 282 may be determined by subtracting the mounted resistance $R_m$ of capacitor 202 when the electrical resistance of electrical resistance element 282 is zero from the required value of mounted resistance $R_{m\text{-}req}$. The n capacitors may then be selected having internal electrical resistance elements 282 with electrical resistances substantially equal to the determined value of electrical resistance.

Figure 25B:
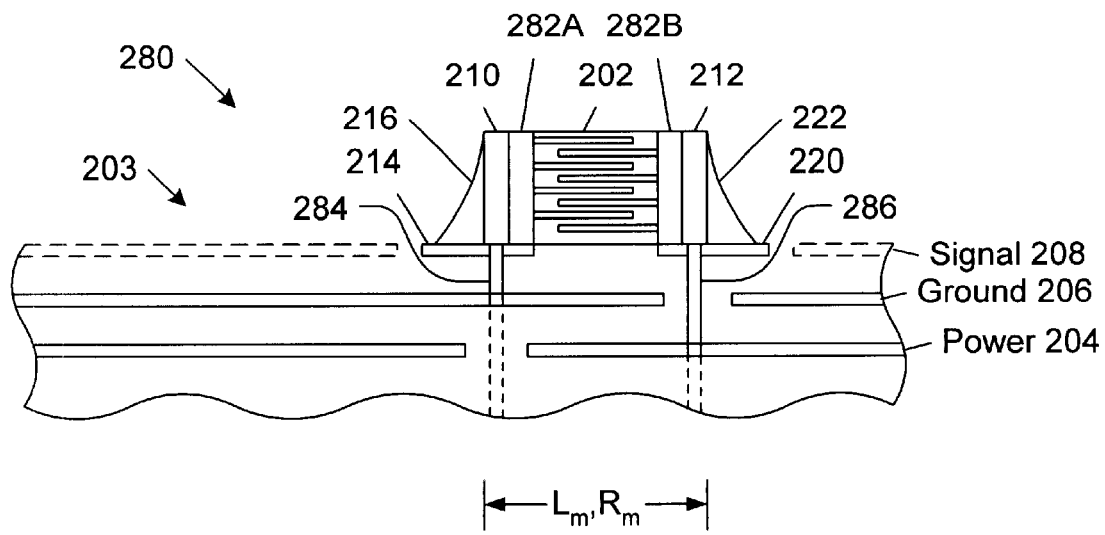
FIG. 25B is a cross sectional view of the portion of the electrical power distribution structure of FIG. 25A wherein the capacitor includes two separate electrical resistance elements on either side of, and in series with, the capacitance element.

FIG. 25B is a cross sectional view of the portion 280 of the electrical power distribution structure of FIG. 25A wherein capacitor 202 includes two separate electrical resistance elements 282A and 282B on either side of, and in series with, the capacitance element. Components of the electrical power distribution structure shown in FIGS. 22–24 and 25A, and described above, are labeled similarly in FIG. 25B.

Figure 25C:
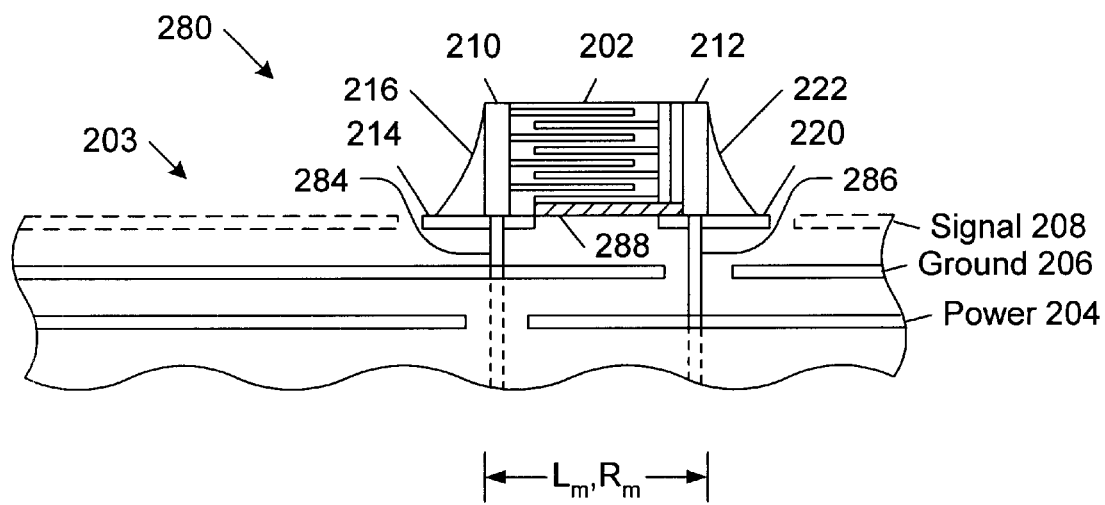
FIG. 25C is a cross sectional view of the portion of the electrical power distribution structure of FIG. 25A wherein the capacitor includes a horizontal resistive layer electrically coupled in series with the capacitance element.

FIG. 25C is a cross sectional view of the portion 280 of the electrical power distribution structure of FIG. 25A wherein capacitor 202 includes a horizontal resistive layer 288 electrically coupled in series with the capacitance element. Components of the electrical power distribution structure shown in FIGS. 22–24 and 25A, and described above, are labeled similarly in FIG. 25B. In the embodiment if FIG. 25C, a bottom edge of a side terminal and a bottom plate of the capacitance element are in contact with horizontal resistive layer 288. Terminal 212 of capacitor 202 is also in contact with horizontal resistive layer 288. As a result, horizontal resistive layer 288 is electrically coupled in series with the capacitance element between terminals 210 and 212 of capacitor 202.

Figure 26A:
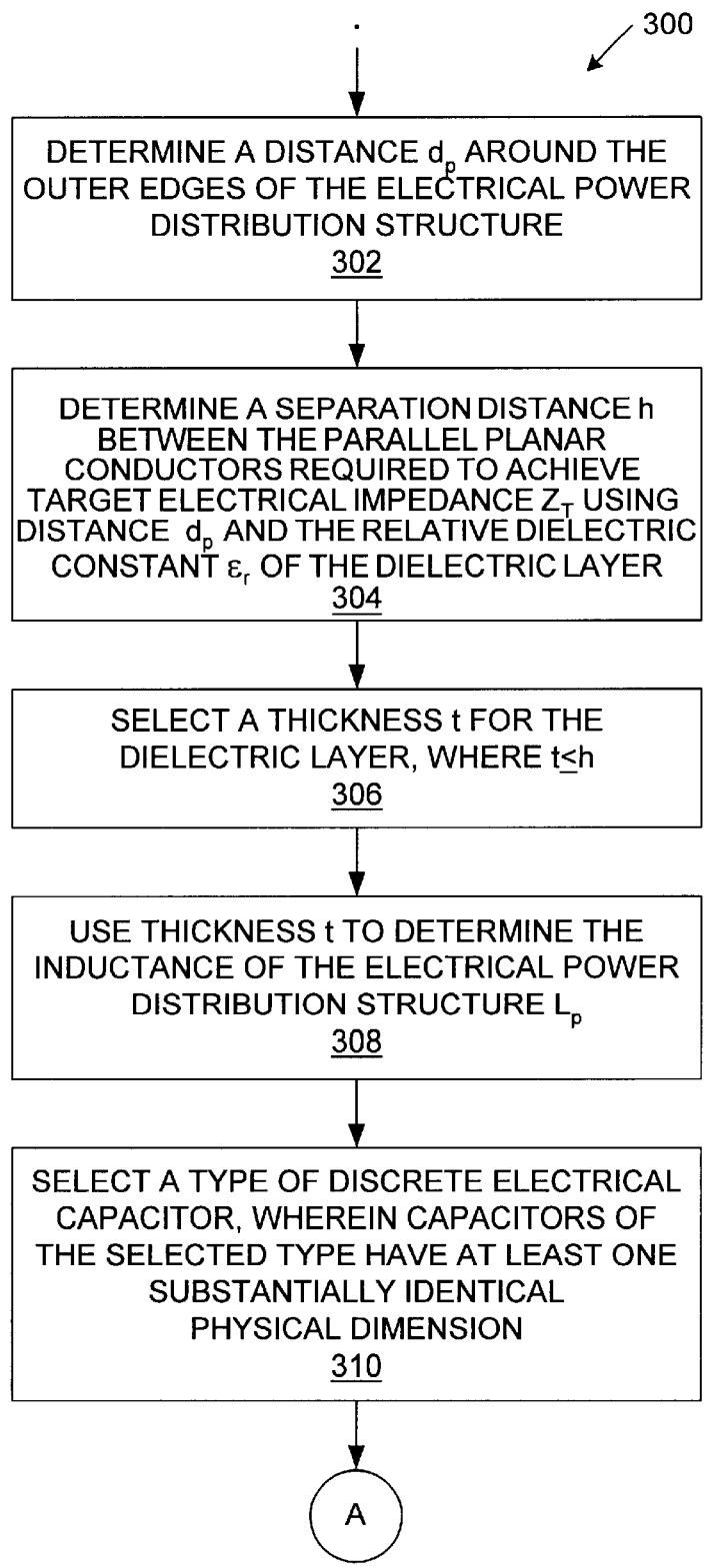
FIGS. 26A–26C in combination form a flow chart of one embodiment of a first method for achieving a target electrical impedance $Z_t$ in an electrical power distribution structure including a pair of parallel planar conductors separated by a dielectric layer.
Figure 26B:
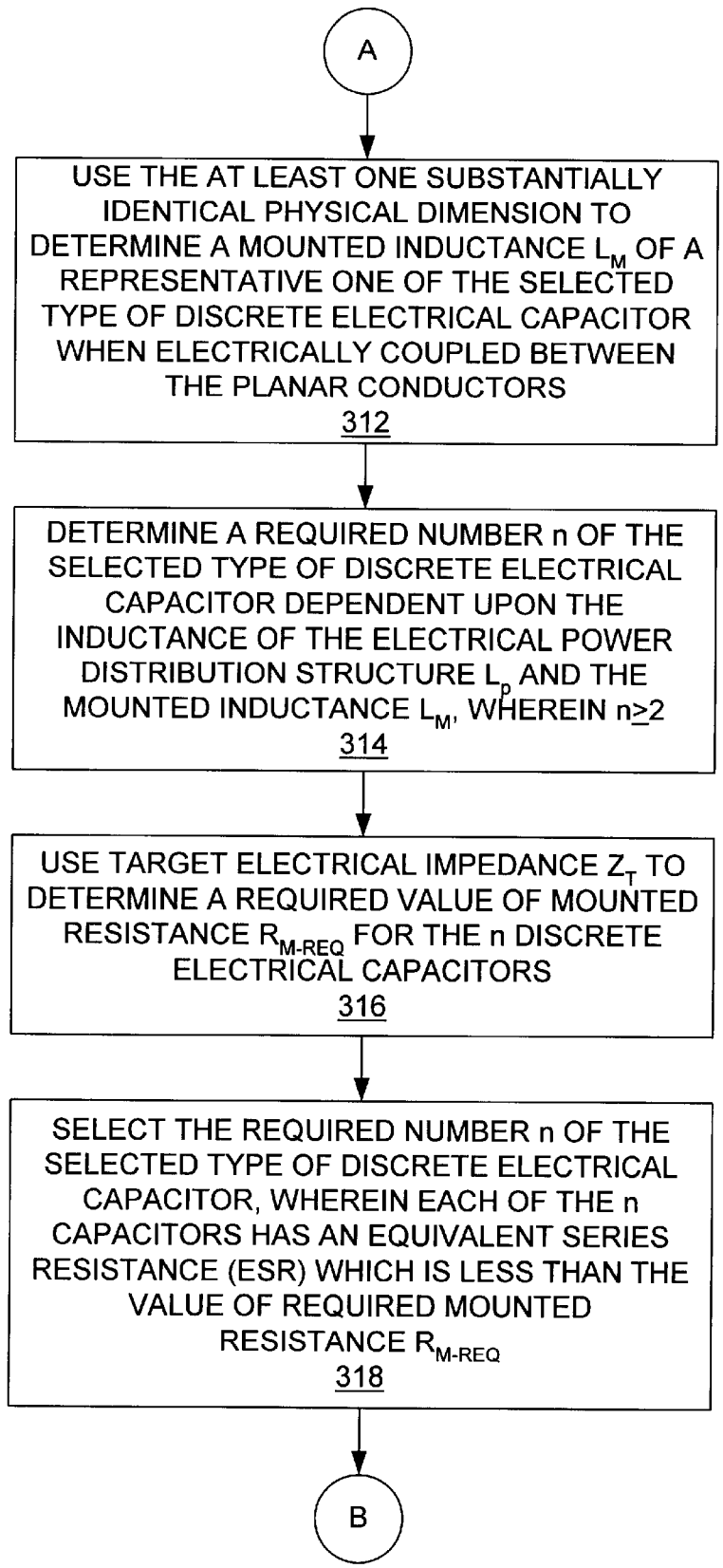
Figure 26C:
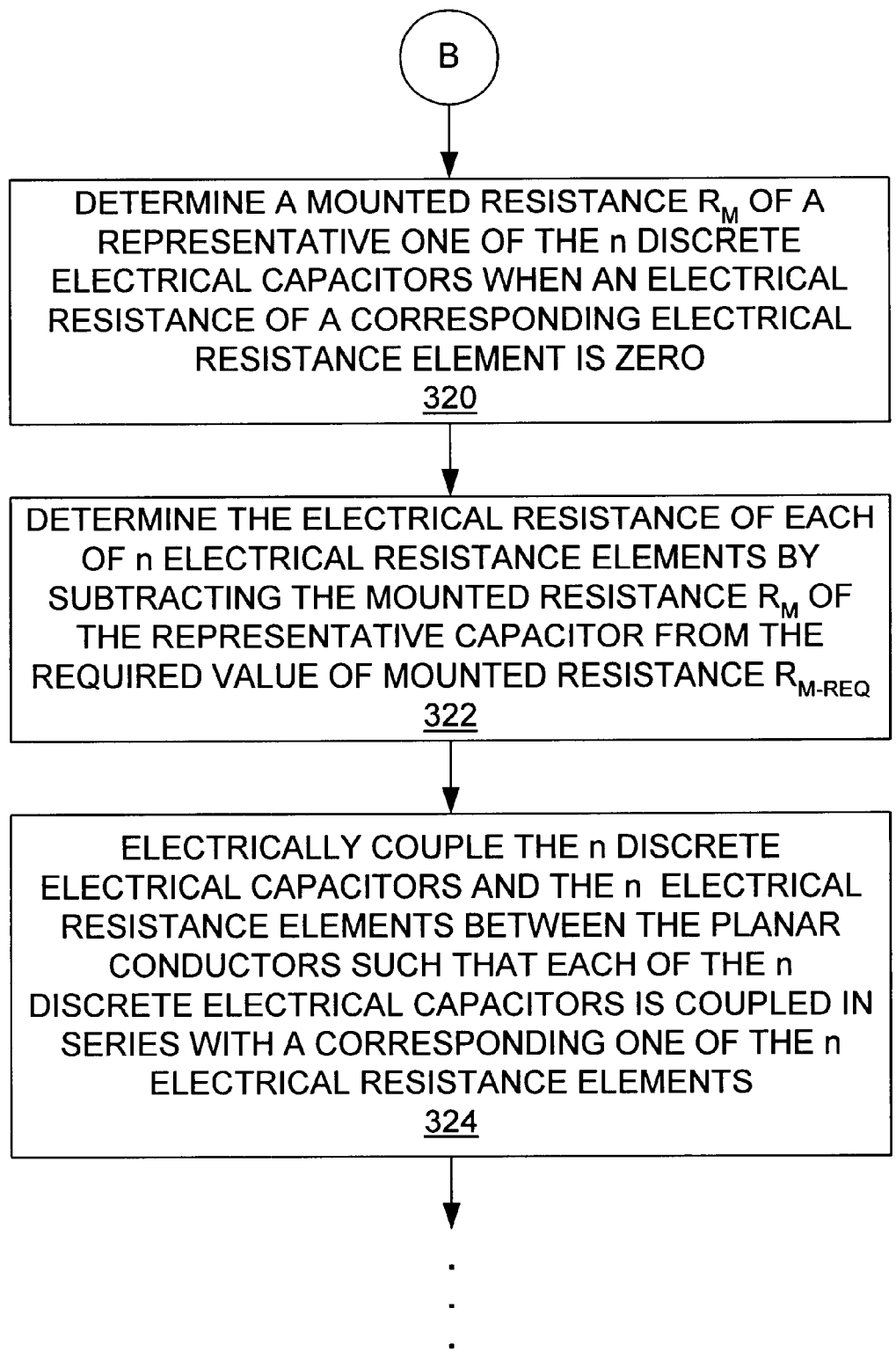
Figure 27A:
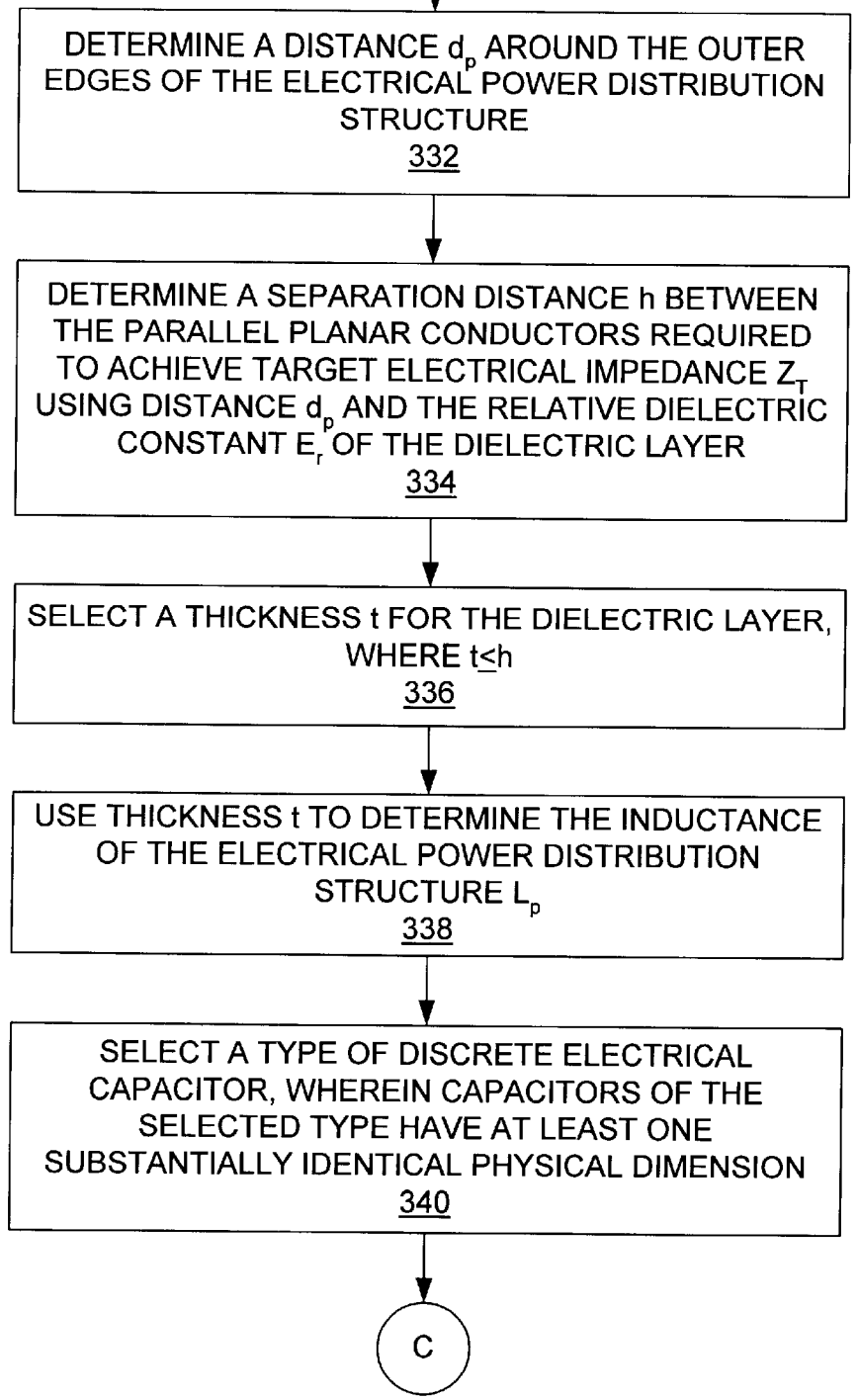
FIGS. 27A–27F in combination form a flow chart of one embodiment of a second method for achieving a target electrical impedance $Z_t$ in an electrical power distribution structure including a pair of parallel planar conductors separated by a dielectric layer.
Figure 27B:
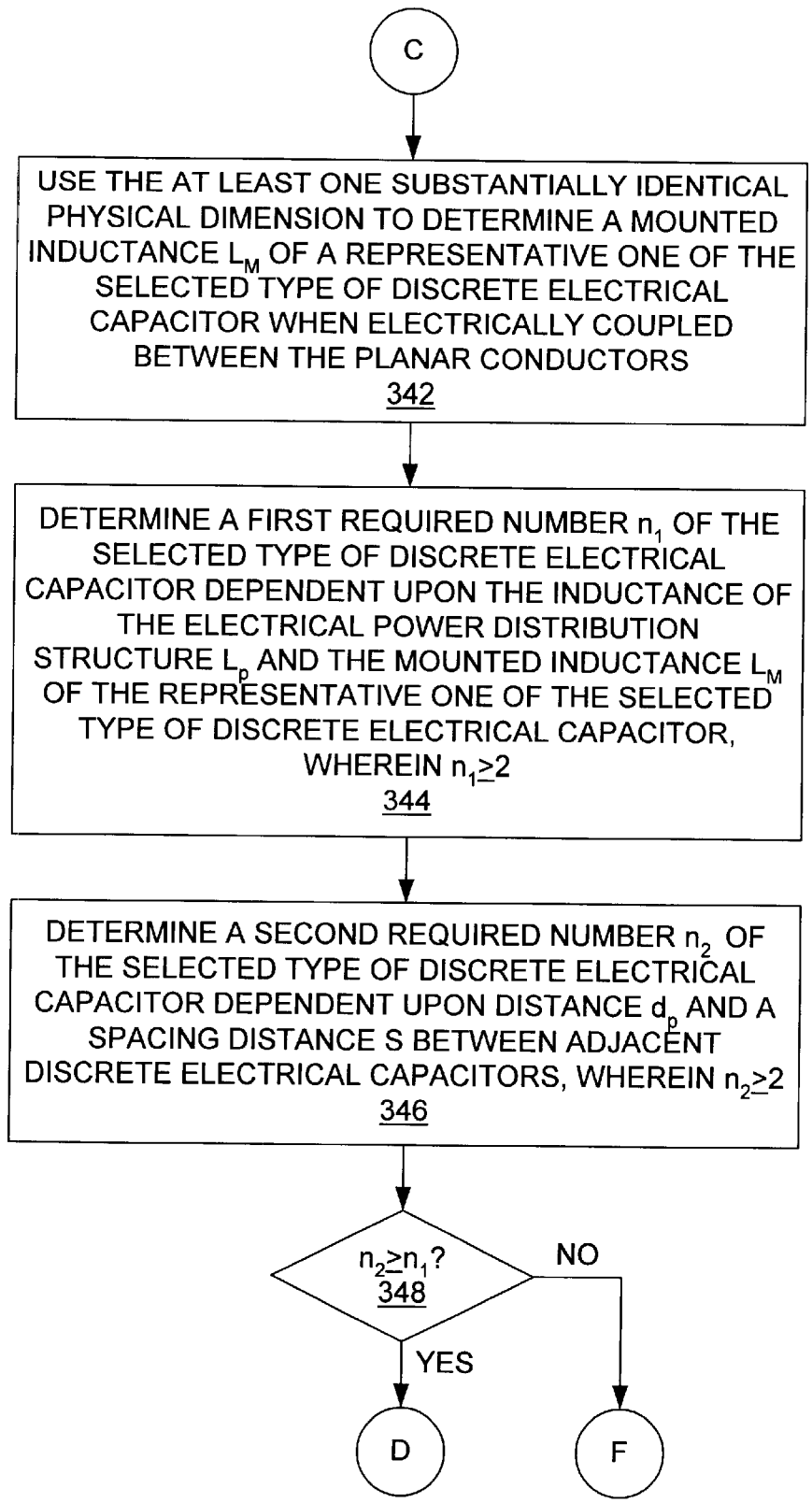
Figure 27C:
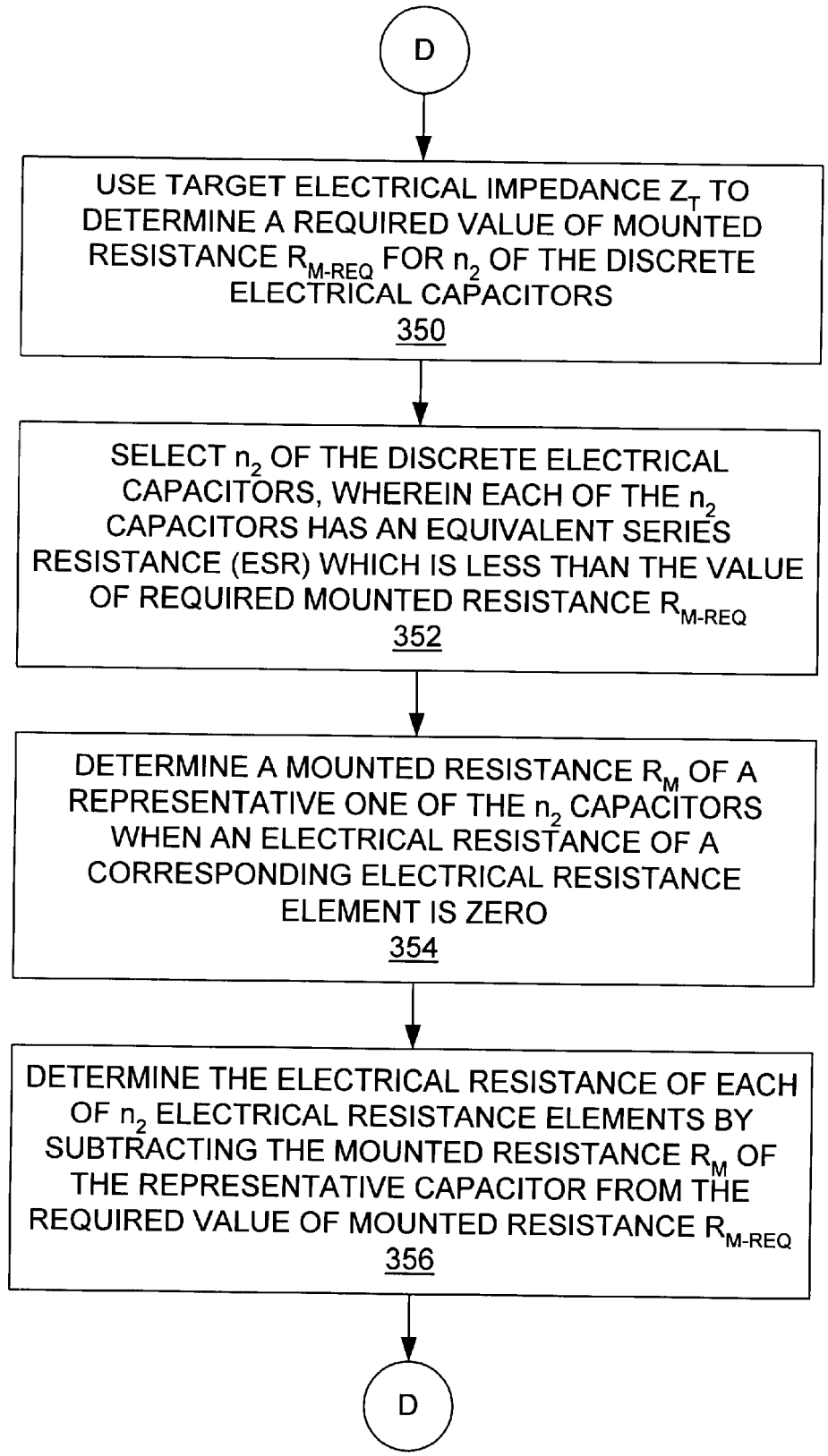
Figure 27D:
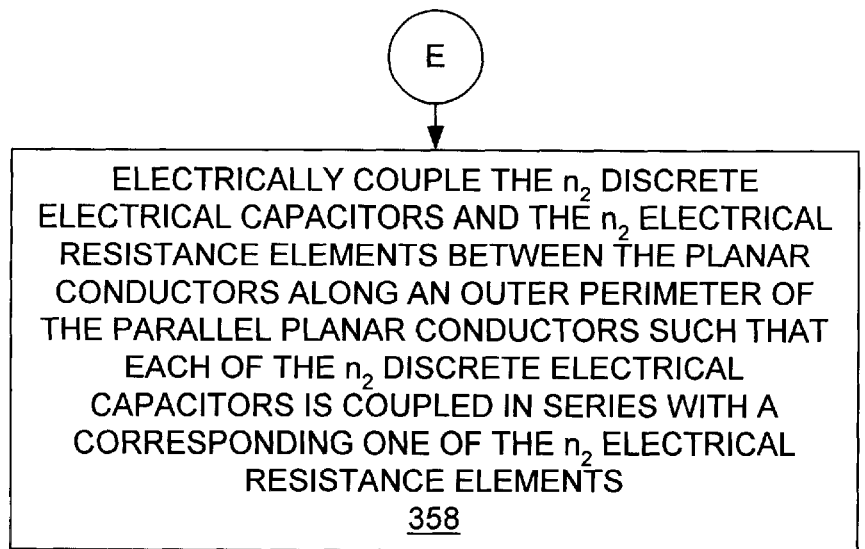
Figure 27F:
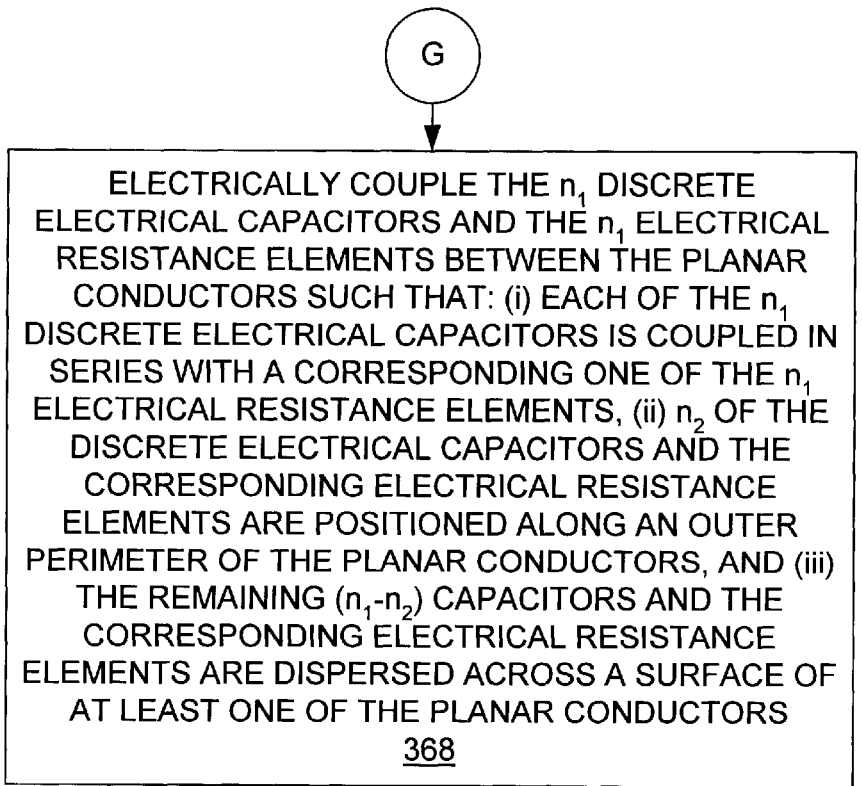
Figure 27E:
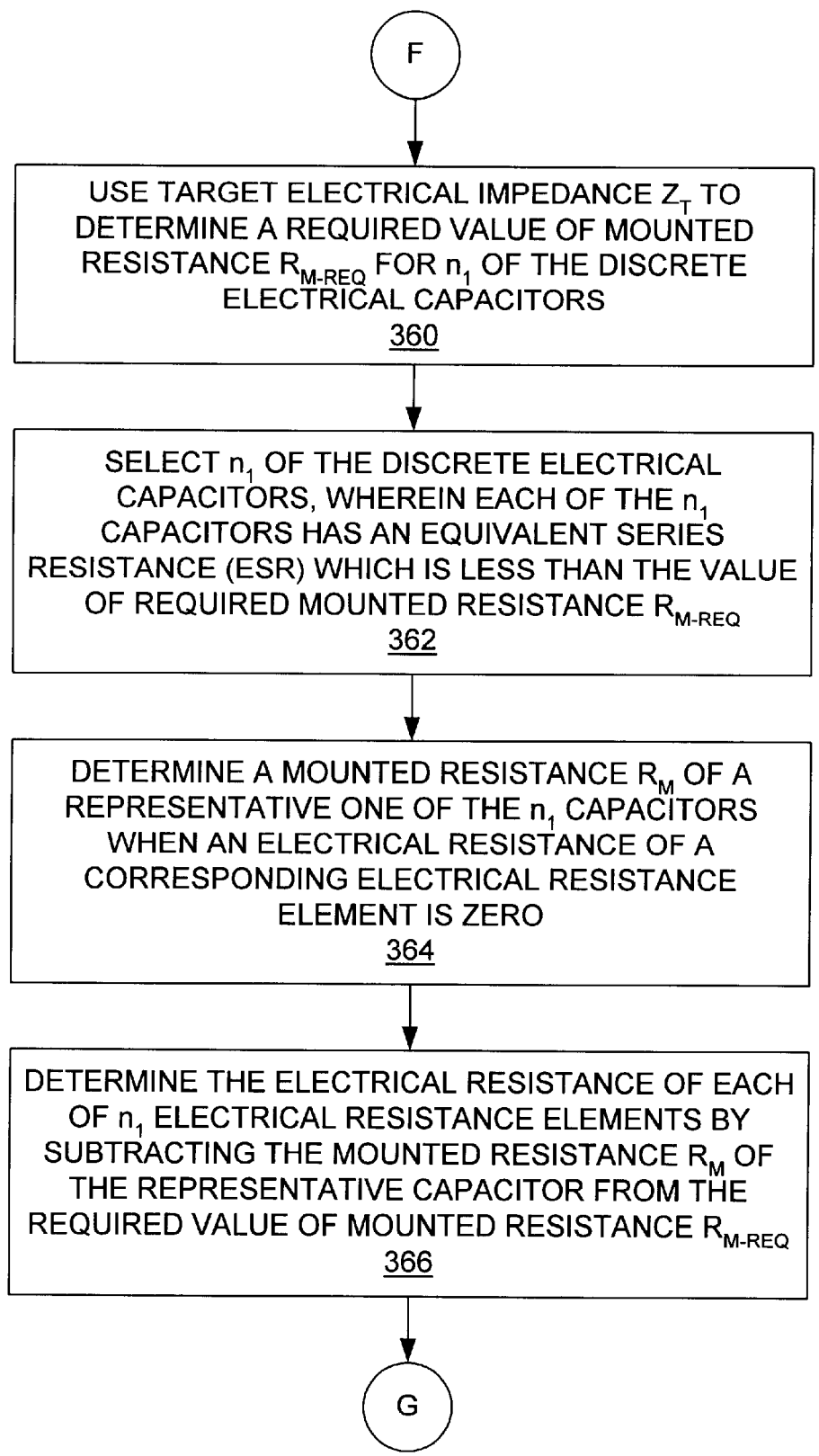

FIGS. 26A–26C in combination form a flow chart of one embodiment of a first method 300 for achieving a target electrical impedance $Z_t$ in an electrical power distribution structure including a pair of parallel planar conductors separated by a dielectric layer. During a step 302, a distance $d_p$ around the outer edges (i.e., the outer perimeter) of the electrical power distribution structure is determined (e.g., measured) as described above. A separation distance h between the parallel planar conductors required to achieve the target electrical impedance $Z_t$ is determined during a step 304 using distance $d_p$ and the relative dielectric constant $\epsilon_r$ of the dielectric layer. The following equation, based on the above empirical formula for the electrical impedance $Z_p$, may be used to determine separation distance h:

$$h(mils) = \frac{(Z_t)(\sqrt{\varepsilon_r})(d_p)}{(0.523)}$$

where impedance $Z_t$ is in ohms and distance $d_p$ is in inches.

During a step 306, a thickness t is selected for the dielectric layer, where $t \leq h$. Step 306 reflects the fact that thicknesses of dielectric layers between electrically conductive layers (e.g., copper sheets) of commercially available multi-layer printed circuit boards are typically selected from a range of available thicknesses. It is very likely that the above empirical formula for h will yield a required separation distance which lies between two available thickness within the range of available thicknesses. Assume, for example, that the above empirical formula for h yields a required separation distance which lies between a first available thickness and second available thickness, where the first available thickness is greater than the second available thickness. In this situation, selected thickness t may be the second available thickness such that $t \leq h$.

During a step 308, the selected dielectric layer thickness t is used to determine the inductance $L_p$ of the electrical power distribution structure. The following equation may be used to calculate inductance $L_p$:

$$L_p = (\mu_0 \cdot t)$$

wherein $\mu_0$ is the permeability of free space. It is noted that the dielectric material used to form the dielectric layer is assumed to be non-magnetic such that the relative permeability $\mu_r$ of the dielectric layer is substantially unity.

A type of discrete electrical capacitor is selected during a step 310, wherein capacitors of the selected type have at least one substantially identical physical dimension (e.g., a length of the capacitor package between terminals) upon which a mounted inductance of the capacitors is dependent. During a step 312, the at least one substantially identical physical dimension is used to determine a mounted inductance $L_m$ of a representative one of the selected type of discrete electrical capacitor when the representative capacitor is electrically coupled between the planar conductors. The mounted inductance $L_m$ of the representative discrete electrical capacitor is the electrical inductance resulting from the coupling of the capacitor between the planar conductors.

During a step 314, a required number n of the selected type of discrete electrical capacitor is determined dependent upon the inductance of the electrical power distribution structure $L_p$ and the mounted inductance $L_m$, wherein $n \geq 2$. The required number n of the selected type of discrete electrical capacitor may be determined using:

$$n = \frac{L_m}{(0.2 \cdot L_p)}.$$

The target electrical impedance $Z_t$ is used during a step 316 to determine a required value of mounted resistance $R_{m\text{-}req}$ for the n discrete electrical capacitors. The required value of mounted resistance $R_{m\text{-}req}$ may be determined using:

$$R_{m\text{-}req} = n \cdot Z_t.$$

During a step 318, the required number n of the selected type of discrete electrical capacitor are selected, wherein each of the n capacitors has an equivalent series resistance (ESR) which is less than the required value of mounted resistance $R_{m\text{-}req}$. During a step 320, a mounted resistance $R_m$ of a representative one of the n discrete electrical capacitors is determined when an electrical resistance of a corresponding electrical resistance element is zero. The electrical resistance of each of n electrical resistance elements is determined during a step 322 by subtracting the mounted resistance $R_m$ of the representative capacitor from the required value of mounted resistance $R_{m\text{-}req}$. During a step 324, the n discrete electrical capacitors and the n electrical resistance elements are electrically coupled between the planar conductors such that each of the n discrete electrical capacitors is coupled in series with a corresponding one of the n electrical resistance elements.

It is noted that during step 306, it is possible that the above empirical formula for h will yield a required separation distance which is less than a minimum available thickness. For example, a minimum thickness of dielectric layers for manufactured printed circuit boards may be 2 mils. If the above empirical formula for h yields a required separation distance which is less than 2 mils, it is possible to add additional pairs of parallel planar conductors to the electrical power distribution structure such that an equivalent thickness t between a representative single pair of parallel planar conductors is achieved. In general, for a structure having n pairs of parallel planar conductors separated by dielectric layers:

$$t = \frac{1}{\sum_{i=1}^{n} \frac{1}{t_i}}$$

where $t_i$ is the thickness of the dielectric layer between the ith pair of the n pairs. The thickness of the dielectric layer between the n pairs of parallel planar conductors may be selected from the range of available thicknesses such that the resulting value of t is less than or equal to h.

FIGS. 27A–27F in combination form a flow chart of one embodiment of a second method 330 for achieving a target electrical impedance $Z_t$ in an electrical power distribution structure including a pair of parallel planar conductors separated by a dielectric layer. During a step 332, a distance $d_p$ around the outer edges (i.e., the outer perimeter) of the electrical power distribution structure is determined (e.g., measured) as described above. A separation distance h between the parallel planar conductors required to achieve the target electrical impedance $Z_t$ is determined during a step 334 using distance $d_p$ and the relative dielectric constant $\epsilon_r$ of the dielectric layer. The following equation, based on the above empirical formula for electrical impedance Zp, may be used to determine separation distance h:

$$h(mils) = \frac{(Z_t)(\sqrt{\epsilon_r})(d_p)}{(0.523)}$$

where impedance $Z_t$ is in ohms and distance $d_p$ is in inches.

During a step 336, a thickness t is selected for the dielectric layer, where t≦h. Step 336 reflects the fact that thicknesses of dielectric layers between electrically conductive layers (e.g., copper sheets) of commercially available multi-layer printed circuit boards are typically selected from a range of available thicknesses. As described above, where the empirical formula for h above yields a required separation distance which lies between a first available thickness and second available thickness, and the first available thickness is greater than the second available thickness, selected thickness t may be the second available thickness such that t≦h.

During a step 338, the selected dielectric layer thickness t is used to determine the inductance $L_p$ of the electrical power distribution structure. The following equation may be used to calculate inductance $L_p$:

$$L_p = (\mu_0 \cdot t)$$

wherein $\mu_0$ is the permeability of free space. Again, it is noted that the dielectric material used to form the dielectric layer is assumed to be non-magnetic such that the relative permeability $\mu_r$ of the dielectric layer is substantially unity.

A type of discrete electrical capacitor is selected during a step 340, wherein capacitors of the selected type have at least one substantially identical physical dimension (e.g., a length of the capacitor package between terminals) upon which a mounted inductance of the capacitors is dependent. During a step 342, the at least one substantially identical physical dimension is used to determine a mounted inductance $L_m$ of a representative one of the selected type of discrete electrical capacitors when the representative capacitor is electrically coupled between the planar conductors. Again, the mounted inductance $L_m$ of the representative discrete electrical capacitor is the electrical inductance resulting from the coupling of the capacitor between the planar conductors.

During a step 344, a first required number $n_1$ of discrete electrical capacitors is determined dependent upon the inductance of the electrical power distribution structure $L_p$ and the mounted inductance $L_m$ of the selected type of discrete electrical capacitor when electrically coupled between the planar conductors, wherein $n_1 \geq 2$. The first required number $n_1$ may be determined using:

$$n_1 = \frac{L_m}{(0.2 \cdot L_p)}.$$

A second required number $n_2$ of the selected type of discrete electrical capacitor is determined during a step 346 dependent upon distance $d_p$ and a spacing distance S between adjacent discrete electrical capacitors, wherein $n_2 \geq 2$. The second required number $n_2$ may be determined using:

$$n_2 = \frac{d_p}{S}.$$

The electrical power distribution structure may be part of an electrical interconnecting apparatus (e.g., a printed circuit board). In this situation, spacing distance S may be less than or equal to a maximum spacing distance $S_{max}$, where $S_{max}$ is a fraction of a wavelength of a maximum frequency $f_{max}$ of a frequency range of electrical signals conveyed within the electrical interconnecting apparatus.

During a decision step 348, the first and second required numbers $n_1$ and $n_2$ are compared. If $n_2 \geq n_1$, step 350 is performed next. On the other hand, if $n_1 > n_2$, step 360 is performed next.

During step 350, the target electrical impedance $Z_t$ is used to determine a required value of mounted resistance $R_{m-req}$ for $n_2$ of the discrete electrical capacitors. The required value of mounted resistance $R_{m-req}$ for the $n_2$ capacitors may be determined using:

$$R_{m-req} = n_2 \cdot Z_t.$$

The number $n_2$ of the discrete electrical capacitors are selected during step 352, wherein each of the $n_2$ capacitors has an equivalent series resistance (ESR) which is less than the value of required mounted resistance $R_{m-req}$. During a step 354, a mounted resistance $R_m$ of a representative one of the $n_2$ capacitors is determined when the representative capacitor is coupled between the pair of parallel planar conductors and when an electrical resistance of a corresponding electrical resistance element is zero. The electrical resistance of each of $n_2$ electrical resistance elements is determined during a step 356 by subtracting the mounted resistance $R_m$ of the representative capacitor from the required value of mounted resistance $R_{m-req}$. During a step 358, the $n_2$ discrete electrical capacitors and the $n_2$ electrical resistance elements are electrically coupled between the planar conductors along an outer perimeter of the parallel planar conductors such that each of the $n_2$ discrete electrical capacitors is coupled in series with a corresponding one of the $n_2$ electrical resistance elements.

During step 360, the target electrical impedance $Z_t$ is used to determine a required value of mounted resistance $R_{m-req}$ for $n_1$ of the discrete electrical capacitors dependent upon.

The required value of mounted resistance $R_{m\text{-}req}$ for the $n_1$ capacitors may be determined using:

$$R_{m\text{-}req} = n_1 \cdot Z_t$$

The number $n_1$ of the discrete electrical capacitors are selected during a step 362, wherein each of the $n_1$ capacitors has an equivalent series resistance (ESR) which is greater than the required value of mounted resistance $R_{m\text{-}req}$. During a step 364, a mounted resistance $R_m$ of a representative one of the $n_1$ capacitors is determined when the representative capacitor is coupled between the pair of parallel planar conductors and when an electrical resistance of a corresponding electrical resistance element is zero. The electrical resistance of each of $n_1$ electrical resistance elements is determined during a step 366 by subtracting the mounted resistance $R_m$ of the representative capacitor from the required value of mounted resistance $R_{m\text{-}req}$. During a step 368, the $n_1$ discrete electrical capacitors and the $n_1$ electrical resistance elements are electrically coupled between the planar conductors such that: (i) each of the $n_1$ discrete electrical capacitors is coupled in series with a corresponding one of the $n_1$ electrical resistance elements, (ii) $n_2$ of the discrete electrical capacitors and the corresponding electrical resistance elements are positioned along an outer perimeter of the planar conductors, and (iii) the remaining $(n_1-n_2)$ capacitors and the corresponding electrical resistance elements are dispersed across a surface of at least one of the planar conductors.

It is noted that during step 336, it is possible that the above empirical formula for h will yield a required separation distance which is less than a minimum available thickness. For example, a minimum thickness of dielectric layers for manufactured printed circuit boards may be 2 mils. If the above empirical formula for h yields a required separation distance which is less than 2 mils, it is possible to add additional pairs of parallel planar conductors to the electrical power distribution structure such that an equivalent thickness t between a representative single pair of parallel planar conductors is achieved. In general, for a structure having n pairs of parallel planar conductors separated by dielectric layers:

$$t = \frac{1}{\sum_{i=1}^{n} \frac{1}{t_i}}$$

where $t_i$ is the thickness of the dielectric layer between the ith pair of the n pairs. The thickness of the dielectric layer between the n pairs of parallel planar conductors may be selected from the range of available thicknesses such that the resulting value of t is less than or equal to h.

Numerous variations and modifications will become apparent to those skilled in the art once the above disclosure is fully appreciated. It is intended that the following claims be interpreted to embrace all such variations and modifications.

What is claimed is:

1. An electrical power distribution structure, comprising:
    a first planar conductor and a second planar conductor, wherein the first planar conductor comprises an island and a remainder surrounding the island;
    an electrical resistance element coupled between the island and the remainder of the first planar conductor; and
    an electrical capacitor comprising a capacitance element electrically coupled between a first terminal and a second terminal, wherein the first terminal of the electrical capacitor is electrically coupled to the island of the first planar conductor, and wherein the second terminal of the electrical capacitor is electrically coupled to the second planar conductor such that the electrical resistance element is electrically coupled in series with the electrical capacitance element between the first and second planar conductors.

2. The electrical power distribution structure as recited in claim 1, wherein the first and second planar conductors are parallel to one another and separated by a dielectric layer.

3. The electrical power distribution structure as recited in claim 1, wherein the island of the first planar conductor is substantially rectangular and has four sides, and wherein the electrical resistance element comprises a pair of resistive stripes, and wherein each of the pair of resistive stripes is electrically coupled between a different side of the island and the remainder of the first planar conductor.

4. The electrical power distribution structure as recited in claim 3, wherein one of the pair of resistive stripes is electrically coupled between a first side of the island and the remainder of the first planar conductor, and wherein the other of the pair of resistive stripes is electrically coupled between a second side of the island opposite the first side and the remainder of the first planar conductor.

5. The electrical power distribution structure as recited in claim 3, wherein each of the pair of resistive stripes is formed from an electrically resistive material.

6. The electrical power distribution structure as recited in claim 3, wherein the electrical power distribution structure forms a part of an electrical interconnecting apparatus.

* * * * *

UNITED STATES PATENT AND TRADEMARK OFFICE
CERTIFICATE OF CORRECTION

PATENT NO.    : 6,525,622 B1  
DATED         : February 25, 2003  
INVENTOR(S)   : Novak et al.

It is certified that error appears in the above-identified patent and that said Letters Patent is hereby corrected as shown below:

<u>Title page, Item [54] and Column 1, line 5,</u>
In the Title change the word "CONDUCTS" to -- CONDUCTORS --

Signed and Sealed this

Seventh Day of October, 2003

JAMES E. ROGAN
*Director of the United States Patent and Trademark Office*